US012721147B2

(12) United States Patent
Xie et al.

(10) Patent No.: US 12,721,147 B2
(45) Date of Patent: Aug. 25, 2026

(54) DIRECT BACKSIDE CONTACT WITH REPLACEMENT BACKSIDE DIELECTRIC

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Son Nguyen, Schenectady, NY (US); Nicholas Alexander Polomoff, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 403 days.

(21) Appl. No.: 17/954,826

(22) Filed: Sep. 28, 2022

(65) Prior Publication Data

US 2024/0105613 A1 Mar. 28, 2024

(51) Int. Cl.

| | |
|---|---|
| ***H01L 23/528*** | (2006.01) |
| ***H01L 29/06*** | (2006.01) |
| ***H01L 29/40*** | (2006.01) |
| ***H01L 29/417*** | (2006.01) |
| ***H01L 29/423*** | (2006.01) |
| ***H01L 29/66*** | (2006.01) |
| ***H01L 29/775*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10W 20/41*** | (2026.01) |

(52) U.S. Cl.
CPC ........ *H10W 20/427* (2026.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01)

(58) Field of Classification Search
CPC ............... H01L 23/5286; H01L 23/535; H01L 21/76897; H10D 30/014; H10D 30/43; H10D 30/6729; H10D 30/6735; H10D 62/121; H10D 64/01; H10D 30/6757; H10D 62/151
USPC .......................................................... 257/347
See application file for complete search history.

(56) References Cited

U.S. PATENT DOCUMENTS

| | | | |
|---|---|---|---|
| 10,103,238 B1 | 10/2018 | Zang et al. |
| 10,840,329 B1 | 11/2020 | Xie et al. |
| 10,957,575 B2 | 3/2021 | Yakimets et al. |
| 11,233,005 B1 | 1/2022 | Chen et al. |
| 11,264,327 B2 | 3/2022 | Chiang et al. |
| 2021/0111115 A1 | 4/2021 | Morrow et al. |

(Continued)

*Primary Examiner* — Tong-Ho Kim
(74) *Attorney, Agent, or Firm* — Harrity & Harrity, LLP

(57) ABSTRACT

A semiconductor device includes a frontside including first metal structures, transistors disposed between the frontside and a backside opposite the frontside, each transistor including a source/drain positioned within a stack of nanolayers, the stack of nanolayers forming a gate structure and a power circuit on the backside and connected to the transistors by backside contacts. A backside dielectric isolation has a horizontal portion along a backside of the gate structure and a vertical portion substantially perpendicular to the backside and self-aligned to selected source/drains to electrically isolate the power circuit from the transistors.

20 Claims, 22 Drawing Sheets

(56) References Cited

U.S. PATENT DOCUMENTS

| | | | |
|---|---|---|---|
| 2021/0134721 A1 | 5/2021 | Chiang et al. | |
| 2021/0202385 A1 | 7/2021 | Huang et al. | |
| 2021/0305252 A1* | 9/2021 | Chiang | H10D 30/024 |
| 2021/0305381 A1 | 9/2021 | Chiang et al. | |
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2021/0391323 A1 | 12/2021 | Shen et al. | |
| 2021/0391325 A1* | 12/2021 | Su | H10D 30/6735 |
| 2021/0391421 A1 | 12/2021 | Chu et al. | |
| 2022/0165733 A1 | 5/2022 | Chen et al. | |
| 2023/0307364 A1* | 9/2023 | Park | H01L 21/7806 |

* cited by examiner 210
280
320
270
230
320
330
150
180
330
135
X
PC
Y1
Y2
330
270
120
260
260
130
110
164
132
132
260
X
Y1
Y2

360
358
356
350
270
500
180
400
380
410

Y2
502
506
320
352
Y1
502
X
350
210
320
230
270
380
400
500
502
504

DIRECT BACKSIDE CONTACT WITH REPLACEMENT BACKSIDE DIELECTRIC

BACKGROUND

The present invention generally relates to a backside contact insulation formation for a backside power distribution network (BSPDN), and more particularly to electrical isolation between a backside contact and gate/channel regions.

Electronic devices can be formed by building up structures on a frontside and a backside of the device. Backside contacts provide connections to active regions on a side opposite the frontside. Overlay issues between the frontside structures and the backside structures can be challenging and can lead to leakage or other issues if misalignment exceeds specifications.

SUMMARY

In accordance with an embodiment of the present invention, a method of forming a semiconductor device includes forming recesses through a stack of nanolayers from a frontside opposite a substrate to a buried semiconductor layer through an intermediate semiconductor layer; filling a portion of the recesses to a height relative to the stack of nanolayers to form a sacrificial plug within the recesses; forming a source/drain on the plug within the recesses; removing the substrate, the intermediate semiconductor layer and the buried semiconductor layer to expose plugs in the recesses from a backside opposite the frontside; burying the plugs that were exposed in a first dielectric material; removing the plugs and a lowest nanolayer in the stack of nanolayers to form a cavity; and filling the cavity with a second dielectric material to form backside dielectric isolation to electrically isolate a transistor formed in a region of the stack of nanolayers from a power circuit on the backside.

In accordance with another embodiment of the present invention, a semiconductor device includes a frontside including first metal structures, transistors disposed between the frontside and a backside opposite the frontside, each transistor including a source/drain positioned within a stack of nanolayers, the stack of nanolayers forming a gate structure and a power circuit on the backside and connected to the transistors by backside contacts. A backside dielectric isolation has a horizontal portion along a backside of the gate structure and a vertical portion substantially perpendicular to the backside and self-aligned to selected source/drains to electrically isolate the power circuit from the transistors.

In accordance with yet another embodiment of the present invention, a semiconductor device includes a frontside including first metal structures, transistors disposed between the frontside and a backside opposite the frontside, each transistor including a source/drain positioned within a stack of nanolayers, the stack of nanolayers forming a gate structure and a backside power rail on a backside power delivery network (BSPDN). A backside interlevel dielectric layer is provided on the backside power rail and the BSPDN. A backside dielectric isolation adjacent to and passing through the backside interlevel dielectric layer. The backside dielectric isolation has a horizontal portion along a backside of the gate structure and a vertical portion substantially perpendicular to the backside and self-aligned to selected source/drains to electrically isolate the power circuit from the transistors.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Principles and embodiments of the present invention relate to forming backside electrical connections with backside dielectric isolation (BDI) structures that assist in isolation of backside contacts or direct backside contacts (DBCs). The BDIs fill regions surrounding the backside to electrically isolate the DBCs from gate and channel regions of a device. Device as described herein refers to a semiconductor device being fabricated or as fabricated in accordance with the present embodiments.

In useful embodiments, the BDIs can include a horizontal component and a vertical component. The horizontal component is oriented substantially parallel to the frontside and the backside while the vertical component would be substantially perpendicular to the frontside and the backside. In one embodiment, the vertical component and the horizontal component include a same dielectric material. In other embodiments, the vertical component and the horizontal component include different dielectric materials.

In one or more embodiments, the BDI can be aligned to a source/drain (S/D) region. In one or more embodiments, vertical BDI is self-aligned to S/D region by forming both in a same trench at different stages during the fabrication process.

In a useful embodiment, the BDI can include a horizontal portion in contact with a gate (e.g., high-k metal gate (HKMG)), and the vertical portion can be aligned to the S/D region in a same column. In one or more embodiments, the BDI can include a seam where the horizontal and vertical components connect. The seam can include a T-shaped structure.

During processing at least one vertical BDI can be removed and replaced with a backside contact. The backside contact can electrically connect a S/D region with a BPR and BSPDN.

The BDI can be formed in an interlevel dielectric layer (ILD), e.g., a backside ILD (BILD). The BDI can include a dielectric material that is different than the BILD dielectric material.

Exemplary applications/uses to which the present invention can be applied include, but are not limited to: digital logic structures and device (e.g., gates, central processing units, etc.) and memory structures and device (e.g., static random access memory (SRAM), dynamic random access memory (DRAM), etc.).

It is to be understood that aspects of the present invention will be described in terms of a given illustrative architecture; however, other architectures, structures, substrate materials and process features and steps can be varied within the scope of aspects of the present invention.

Figure 1:
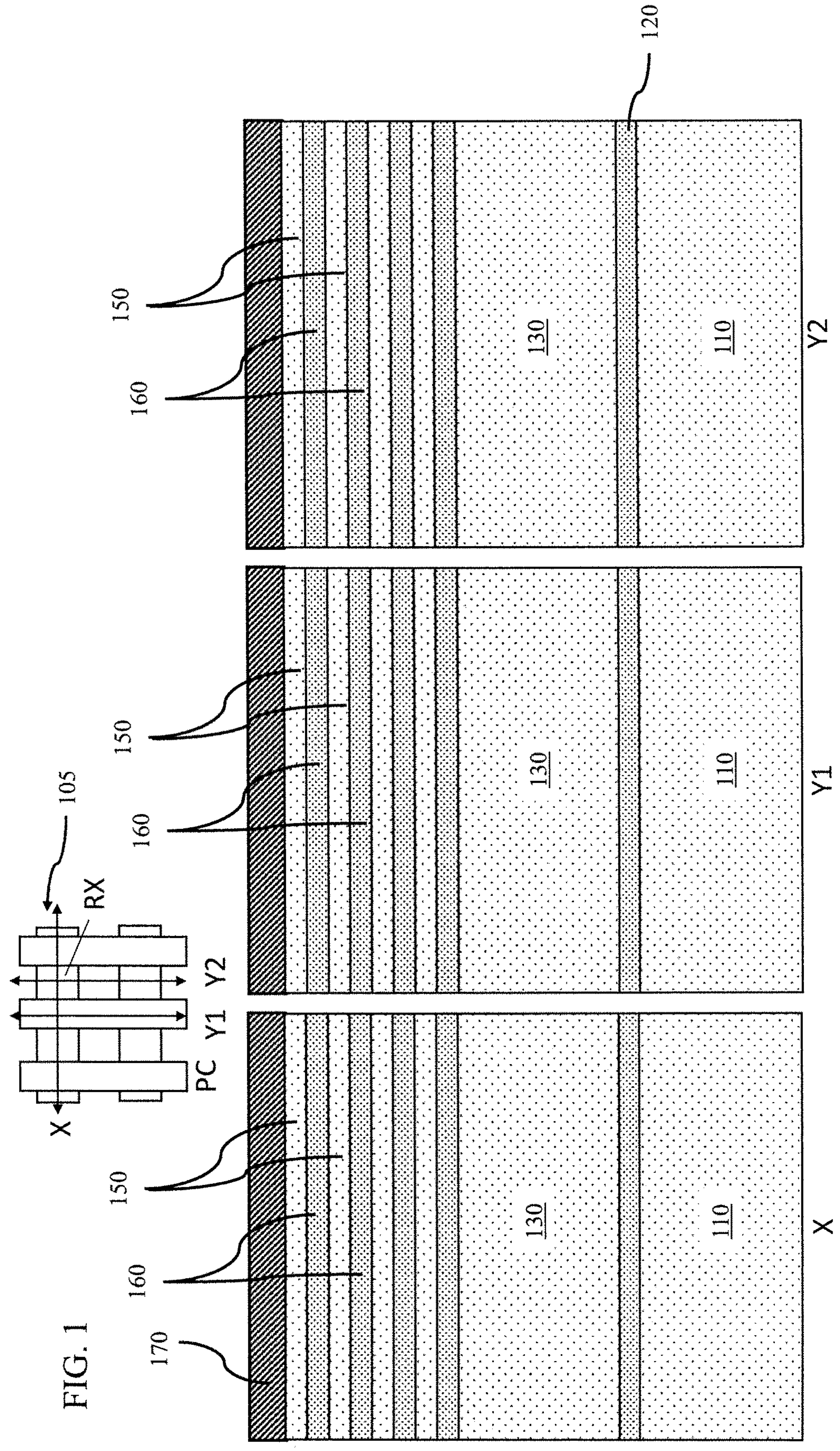
FIG. 1 shows cross-sectional side views of alternating nanosheet layers and sacrificial layers on a substrate, in accordance with an embodiment of the present invention.

Referring now to the drawings in which like numerals represent the same or similar elements and initially to FIG. 1, a cross-sectional side view shows alternating nanosheet layers and sacrificial layers on a substrate, in accordance with an embodiment of the present invention. A top view 105 shows how cross sections X, Y1 and Y2 are cut in a schematic device structure. View 105 also shows PC and RX regions which are respectively metal lines and active regions. The view 105 provides perspective to show how each process step affects each region of the device during fabrication.

In one or more embodiments, alternating semiconductor nanosheet layers 150 and nanosheet layers 160 can be formed on an intermediate semiconductor layer 130. A buried semiconductor layer 120 can be disposed between the intermediate semiconductor layer 130 and a substrate 110. In various embodiments, a masking layer 170 can be formed on the alternating sacrificial nanosheet layers 150 and semiconductor nanosheet layers 160.

In various embodiments, the substrate 110 and the intermediate semiconductor layer 130 can be a semiconductor material, for example, silicon (Si), silicon-germanium (SiGe), silicon carbide (SiC), or III-V compound semiconductor material (e.g., gallium-arsenide (GaAs)). In some embodiments, the substrate 110, the intermediate semiconductor layer 130 and nanosheet layers 150 can include the same or different semiconductor materials. In one or more embodiments, the substrate 110 and the intermediate semiconductor layer 130 can include Si, and the buried semiconductor layer 120 can include, e.g., silicon-germanium (SiGe) and act as a buried etch stop layer.

In various embodiments, the buried semiconductor layer 120 can be epitaxially grown on the substrate 110. Likewise, the intermediate semiconductor layer 130 can be epitaxially grown on the buried semiconductor layer 120.

In various embodiments, the nanosheet layers 160 can be silicon-germanium (SiGe) layers having a germanium concentration sufficient to allow selective etching and removal relative to the nanosheet layers 150. The nanosheet layers 150 can be, for example, silicon (Si). In various embodiments, the silicon-germanium (SiGe) layers employed can have a germanium concentration of less than about 35 atomic percent (at. %).

In various embodiments, the masking layer 170 can be a hardmask, dielectric material, for example, silicon nitride, silicon boronitride, etc., where the masking layer 170 can have multiple layers of masking materials.

Figure 2:
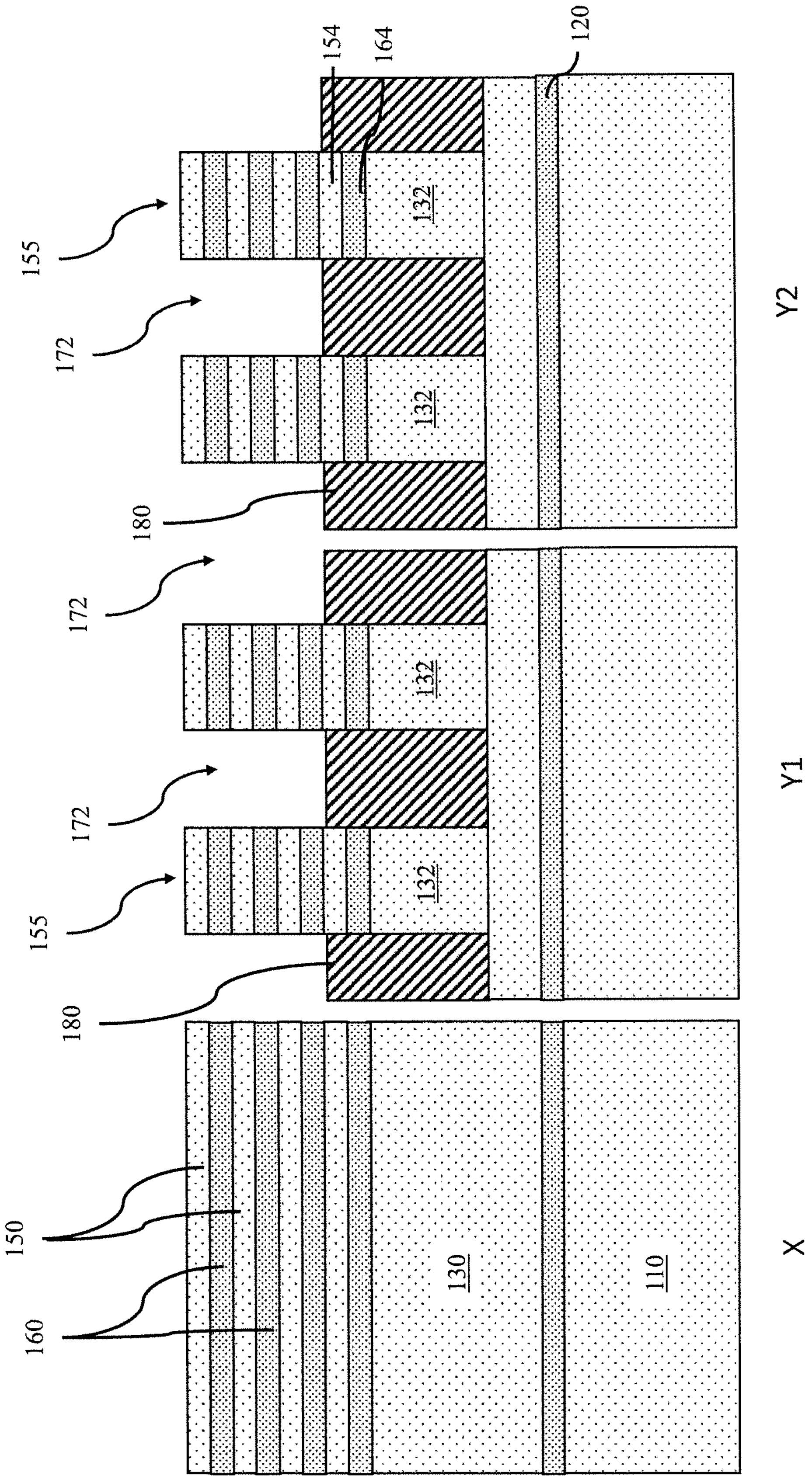
FIG. 2 shows cross-sectional side views of patterned nanosheet stacks on a substrate with intervening shallow trench isolation (STI) regions, in accordance with an embodiment of the present invention.

FIG. 2 includes cross-sectional side views showing patterned nanosheet stacks 155 on a substrate with intervening shallow trench isolation (STI) regions 180, in accordance with an embodiment of the present invention.

In one or more embodiments, the masking layer 170, nanosheet layers 150 and sacrificial nanosheet layers 160 can be patterned, for example, by lithography and etching (e.g., reactive ion etching (RIE)), to form nanosheet templates (masks) (not shown). The stacks 155 can be etched to a predetermined depth, e.g., using a timed etch to form trenches 172 into the intermediate semiconductor layer 130 to form intermediate semiconductor mesas 132 beneath the patterned nanosheet stack 155 of alternating sacrificial nanosheet sections of layers 150 and 160.

In one or more embodiments, shallow trench isolation regions 180 can be formed adjacent to the intermediate semiconductor mesa(s) 132, where a top surface of the shallow trench isolation regions 180 can be at or slightly above bottom nanosheet layers 154 and 164. The shallow trench isolation regions 180 can be formed by a deposition, planarization, and selective etch-back. In various embodiments, a portion of the intermediate semiconductor layer 130 can remain between the bottom surface of the shallow trench isolation regions 180 and the top surface of the buried semiconductor layer 120, where the etching of the intermediate semiconductor layer 130 does not extend all the way down to the buried semiconductor layer 120.

In various embodiments, the shallow trench isolation regions 180 can be formed of an electrically insulating dielectric material, for example, silicon oxide ($SiO_x$), silicon oxynitride (SiON), and combinations thereof.

Figure 3:
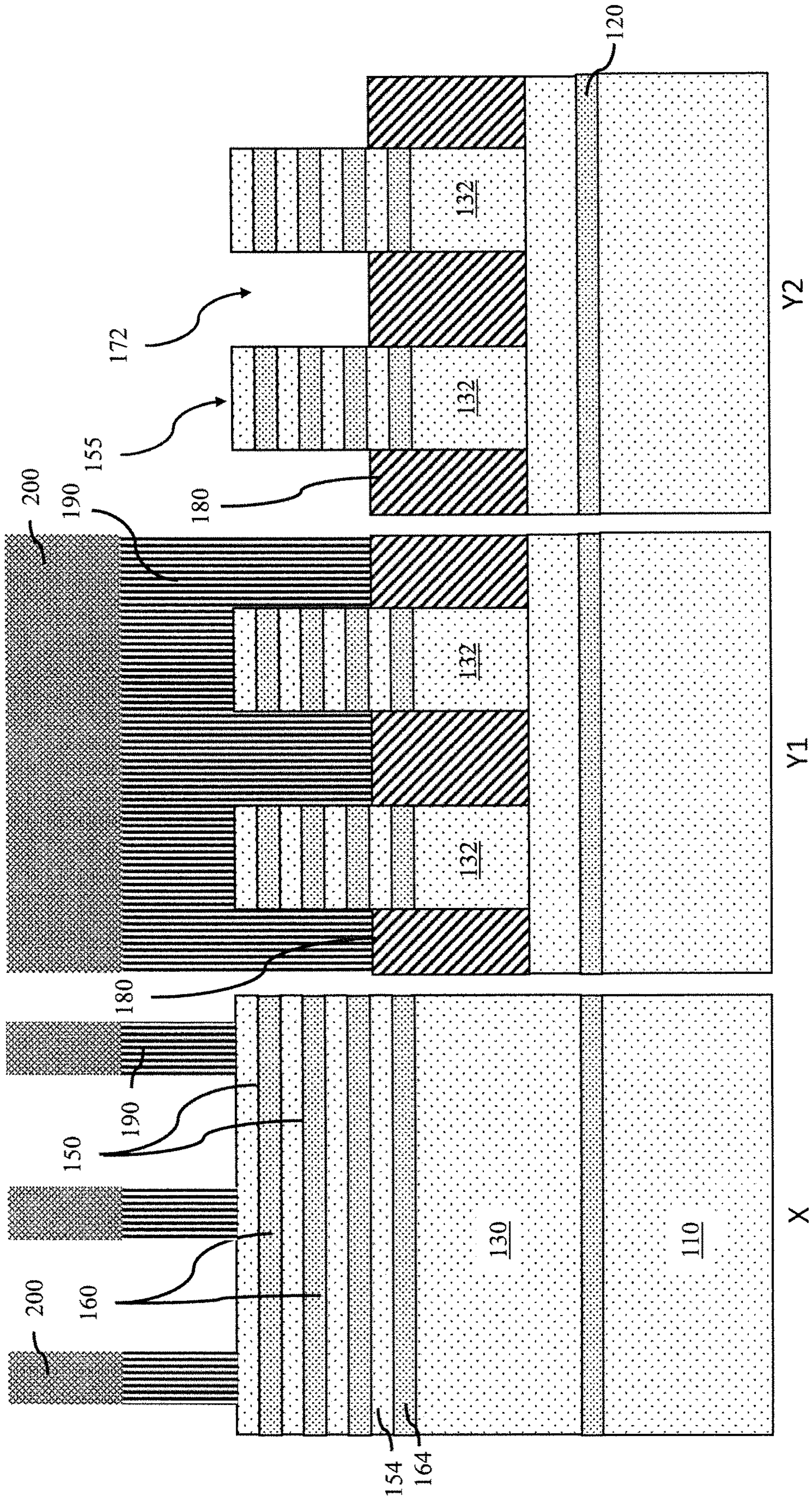
FIG. 3 shows cross-sectional side views of dummy gate structures with gate masks formed across the nanosheet stacks, in accordance with an embodiment of the present invention.

FIG. 3 includes cross-sectional side views showing dummy gate structures 190 with gate hardmask 200 formed across the nanosheet stacks, in accordance with an embodiment of the present invention.

In one or more embodiments, dummy gate structures 190 and a dummy gate cap 200 can be formed on the stacks 155 of alternating nanosheets. One or more dummy gate structures 190 can be formed on the stack 155 of alternating nanosheet layers 150, 160, for example, by forming and patterning a dummy gate layer through lithography and etching.

In various embodiments, the dummy gate structures 190 can be, for example, amorphous silicon (a-Si), amorphous carbon (a-C), and combinations thereof. Note that a thin layer of conformal $SiO_2$ can be deposited prior to the a-Si deposition. In various embodiments, the dummy gate cap 200 can be, for example, silicon nitride (SiN), silicon boro carbonitride (SiBCN), silicon oxy carbide (SiCO), silicon oxy carbonitride (SiOCN), and combinations thereof.

Figure 4:
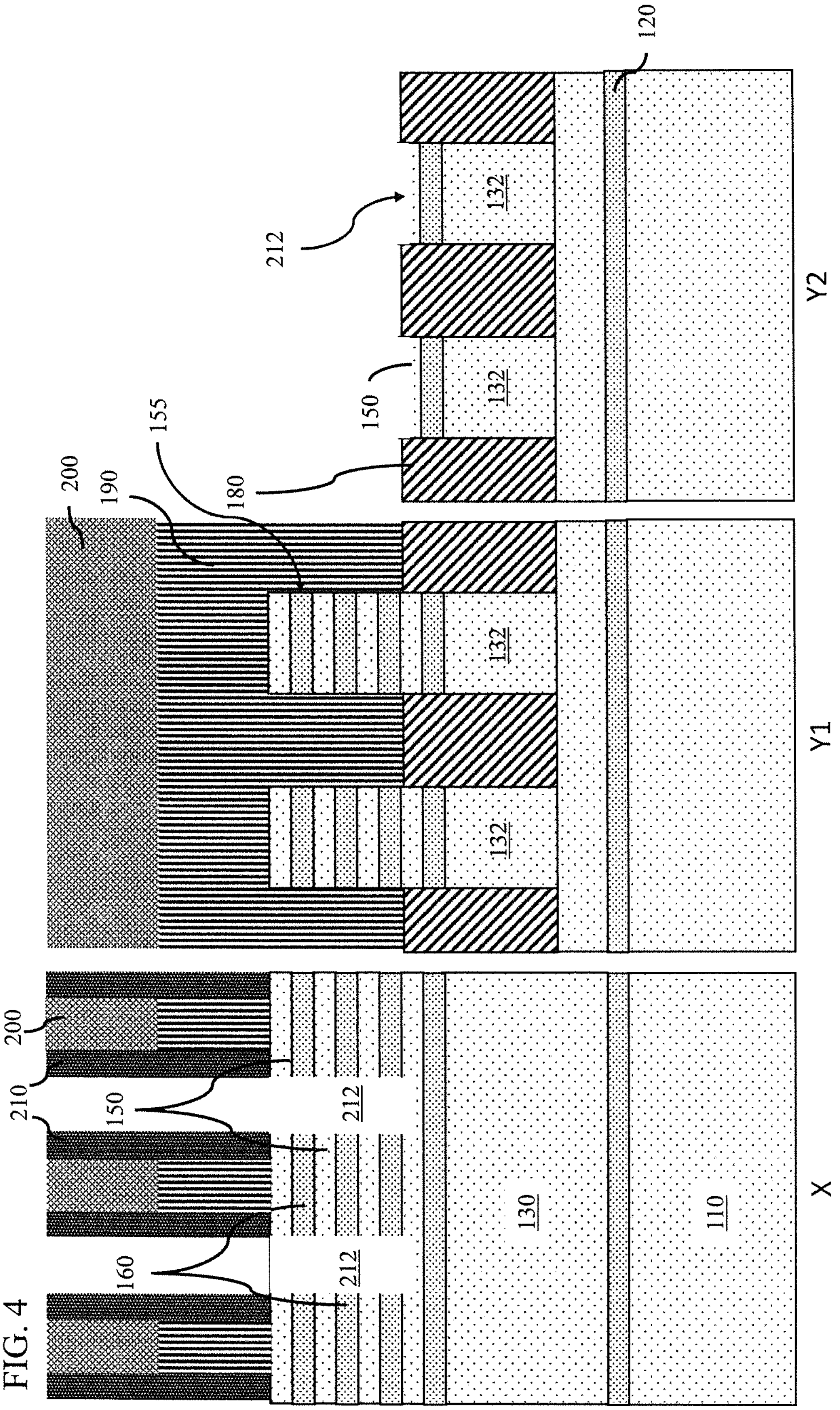
FIG. 4 shows cross-sectional side views of the formation of insulating dielectric sidewalls or sidewalls spacers on the dummy gate structures, in accordance with an embodiment of the present invention.

FIG. 4 includes cross-sectional side views showing the formation of insulating dielectric sidewalls or sidewalls spacers 210 on the dummy gate structures 190 and the dummy gate caps 200, in accordance with an embodiment of the present invention.

In one or more embodiments, an insulating layer can be formed on the dummy gate structures 190 and hardmask 200, where the insulating dielectric sidewalls can be formed as a single layer by a conformal deposition (e.g., atomic layer deposition (ALD)), and an etch-back performed to remove portions of the insulating layer between the stacks and dummy gate structures. In various embodiments, the insulating dielectric sidewalls 210 can be, for example, silicon nitride (SiN), silicon boro carbonitride (SiBCN), silicon oxy carbide (SiCO), silicon oxy carbonitride (SiOCN), and combinations thereof.

After the formation of the spacers 210, another etch is performed to form recesses 212 through the nanosheet layers 150, 160 and the etch stops in the bottom most nanosheet layer 154, without etching into bottom most sacrificial nanosheet layer 164 (see recesses 212 in sections X and Y2 of FIG. 4).

Figure 5:
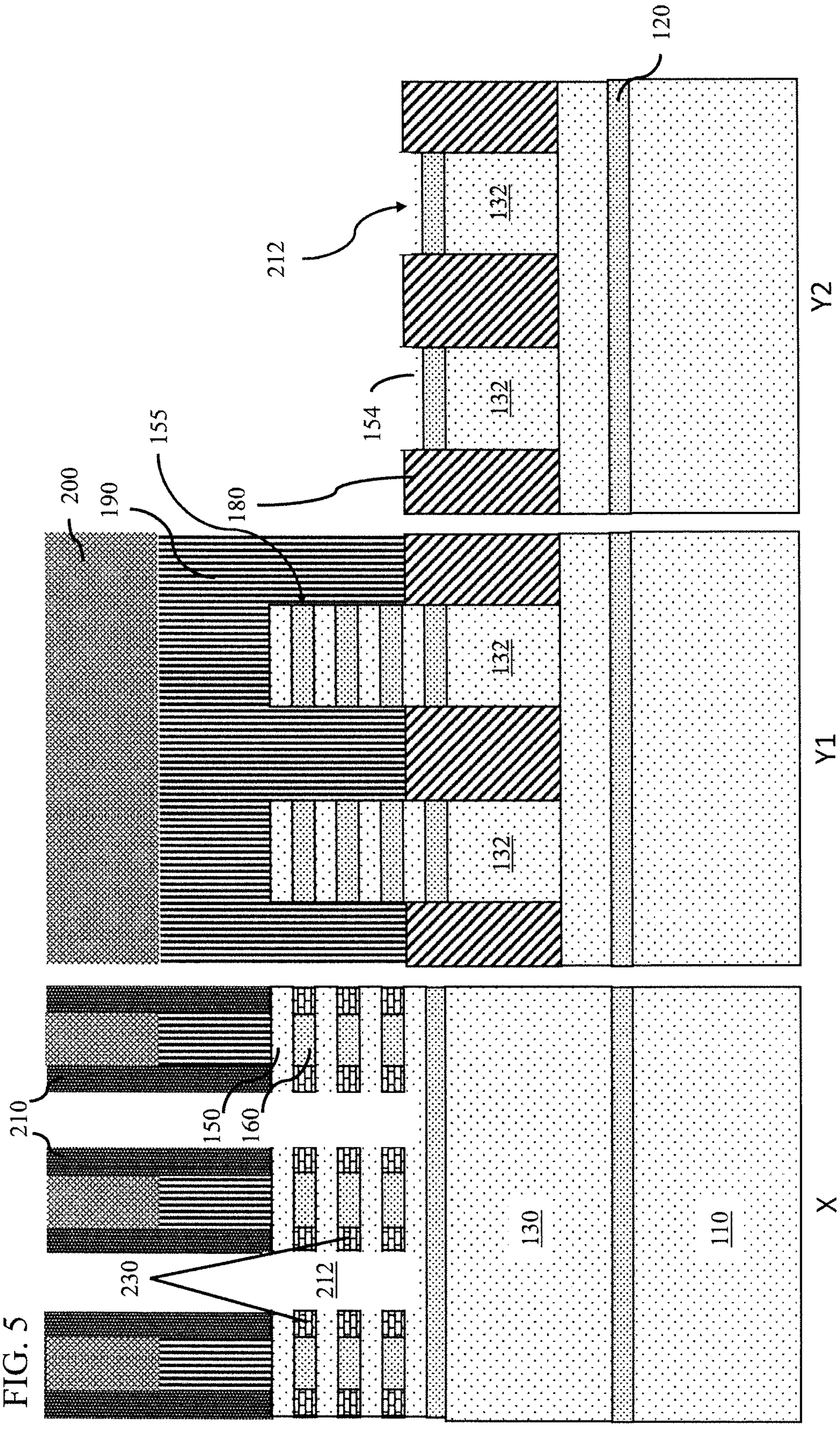
FIG. 5 includes cross-sectional side views showing the removal of a lateral portion of the nanosheet layers and formation of inner spacers in the recesses, in accordance with an embodiment of the present invention.

FIG. 5 includes cross-sectional side views showing the removal of a lateral portion of alternating nanosheet layers and formation of inner spacers 230 in the recesses, in accordance with an embodiment of the present invention.

In various embodiments, a portion of each of the alternating sacrificial nanosheet segments 160 can be removed to form recesses, where a dielectric insulating material can be formed in the recesses to form inner spacers 230. The inner spacers 230 can be formed by a conformal deposition (e.g., ALD), and an isotropic etch-back that leaves dielectric insulating material in the channels.

In various embodiments, the inner spacers 230 can be a dielectric insulating material, including, but not limited to, silicon nitride (SiN), silicon boro carbonitride (SiBCN), silicon oxy carbide (SiCO), silicon oxy carbonitride (SiOCN), and combinations thereof. In various embodiments, inner spacers 230 can be the same material as the insulating dielectric sidewalls 210.

Figure 6:
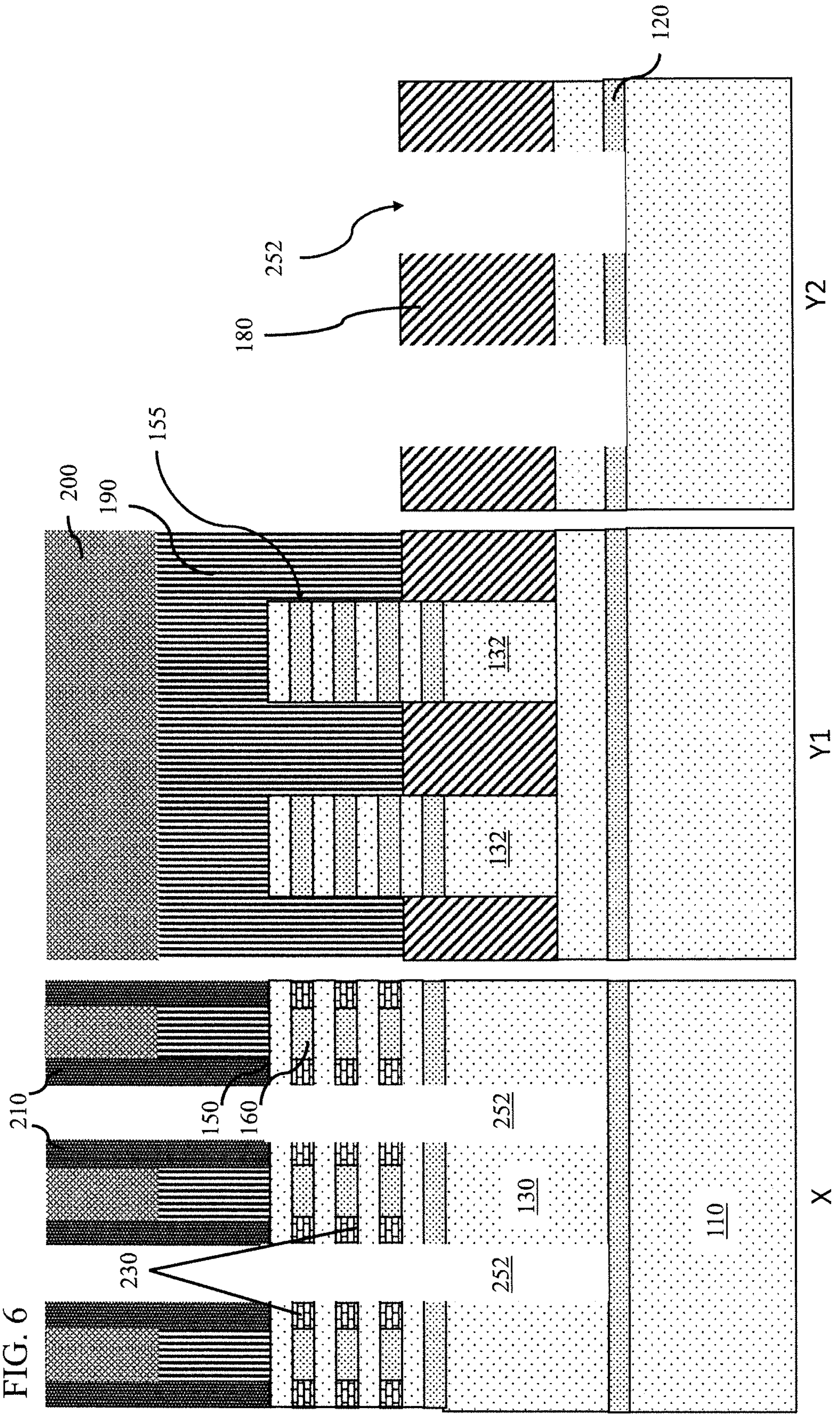
FIG. 6 includes cross-sectional side views showing removal of a portion of underlying intermediate semiconductor layer to form trenches to a buried semiconductor layer, in accordance with an embodiment of the present invention.

FIG. 6 includes cross-sectional side views showing removal of a portion of underlying intermediate semiconductor layer 130 to form trenches 252 to the buried semiconductor layer 120, in accordance with an embodiment of the present invention.

In various embodiments, the portion of the intermediate semiconductor layer 130 exposed at the bottom of the trenches 212 can be removed using a selective directional etch (e.g., RIE) to expose the underlying buried semiconductor layer 120, while leaving the insulating dielectric sidewalls 210 and inner spacers 230.

Figure 7:
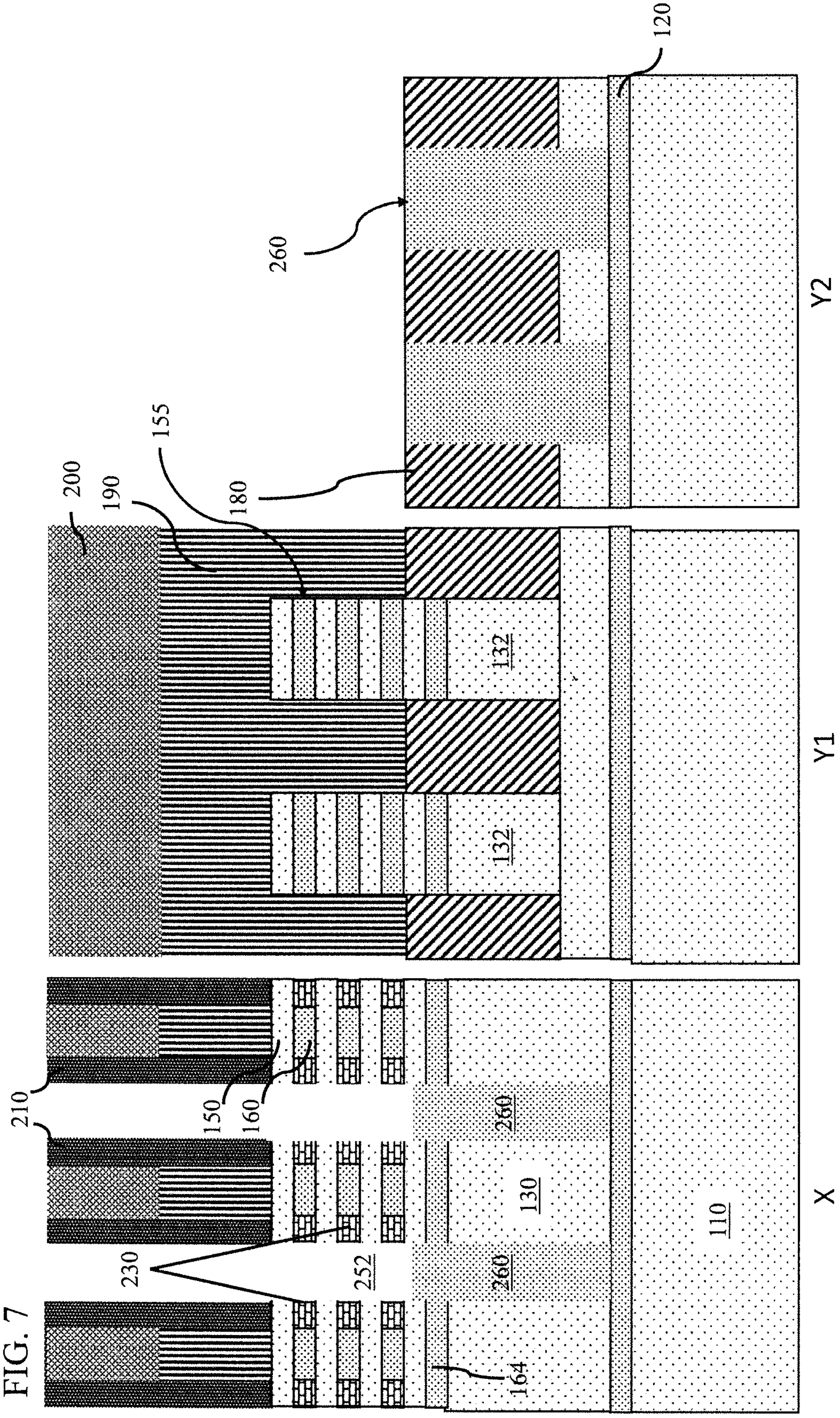
FIG. 7 includes cross-sectional side views showing sacrificial plugs formed on the buried semiconductor layer, in accordance with an embodiment of the present invention.

FIG. 7 includes cross-sectional side views showing sacrificial plugs 260 formed on the buried semiconductor layer 120, in accordance with an embodiment of the present invention.

In one or more embodiments, sacrificial plugs 260 can be formed on the buried semiconductor layer 120, where the sacrificial plugs 260 can be formed by bottom-up epitaxial growth from the exposed semiconductor layer 120, with faster growth rate in the (100) surface direction. A cyclic epitaxial growth/etch back process can be used to ensure the bottom-up epitaxial growth with suppression of epitaxial growth from sidewalls of exposed nanosheet layers 164.

In one or more embodiments, the sacrificial plugs 260 form plugs or gages for locating and self-aligning other structures to be formed in trenches 252. The sacrificial plugs 260 can be employed, e.g., to support the formation of source/drain regions in later steps. The epitaxial growth process permits the source/drain regions to be appropriately located in a vertical region in trenches 252 and has an upper surface defined by the epitaxial growth process. The epitaxial growth process can be self-limiting and set the height of the plug or gage (sacrificial plugs 260), which becomes the low end of the source/drains 270 (FIG. 8).

Figure 8:
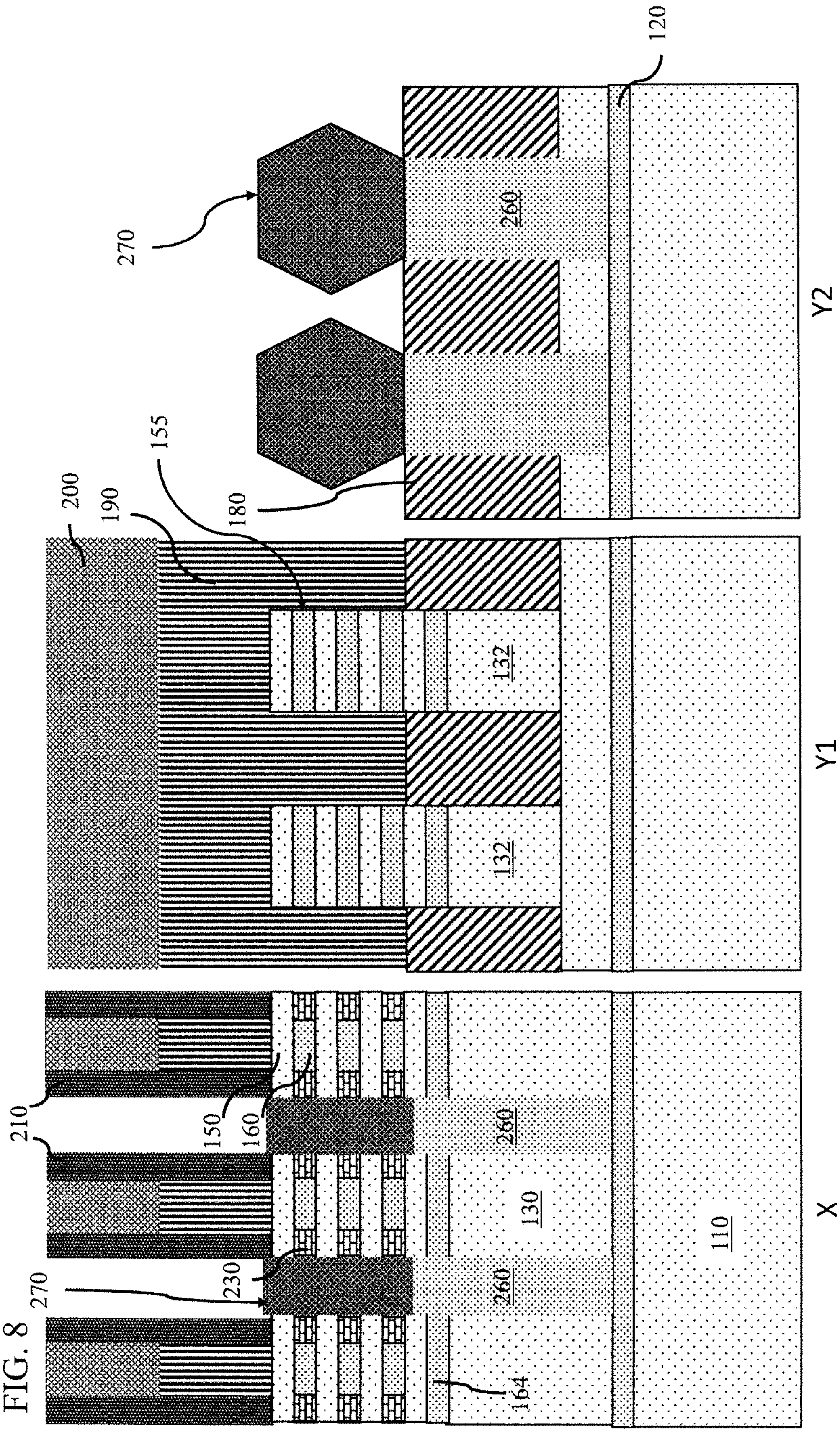
FIG. 8 includes cross-sectional side views showing source/drains formed on the sacrificial plugs, in accordance with an embodiment of the present invention.

FIG. 8 includes cross-sectional side views showing source/drains 270 formed on the sacrificial plugs 260, in accordance with an embodiment of the present invention.

In one or more embodiments, source/drains 270 can be formed on the sacrificial plugs 260 and between laterally exposed adjacent nanosheet segments 150 where the source/drains 270 can be formed by both bottom-up epitaxial growth from sacrificial plug 260 and lateral epitaxial growth from the exposed sides of the semiconductor nanosheet layer segments 150. The inner spacers 230 can electrically separate the nanosheet segments 160 from the source/drains 270. The source/drains 270 are formed on a frontside of the device.

In various embodiments, a portion of the insulating dielectric sidewalls 210 can cover the sidewalls of the source/drains 270. The source/drains 270 can extend above the tops of the STI 180 and can take a polyhedral cross-sectional shape, e.g., a hexagonal.

Figure 9:
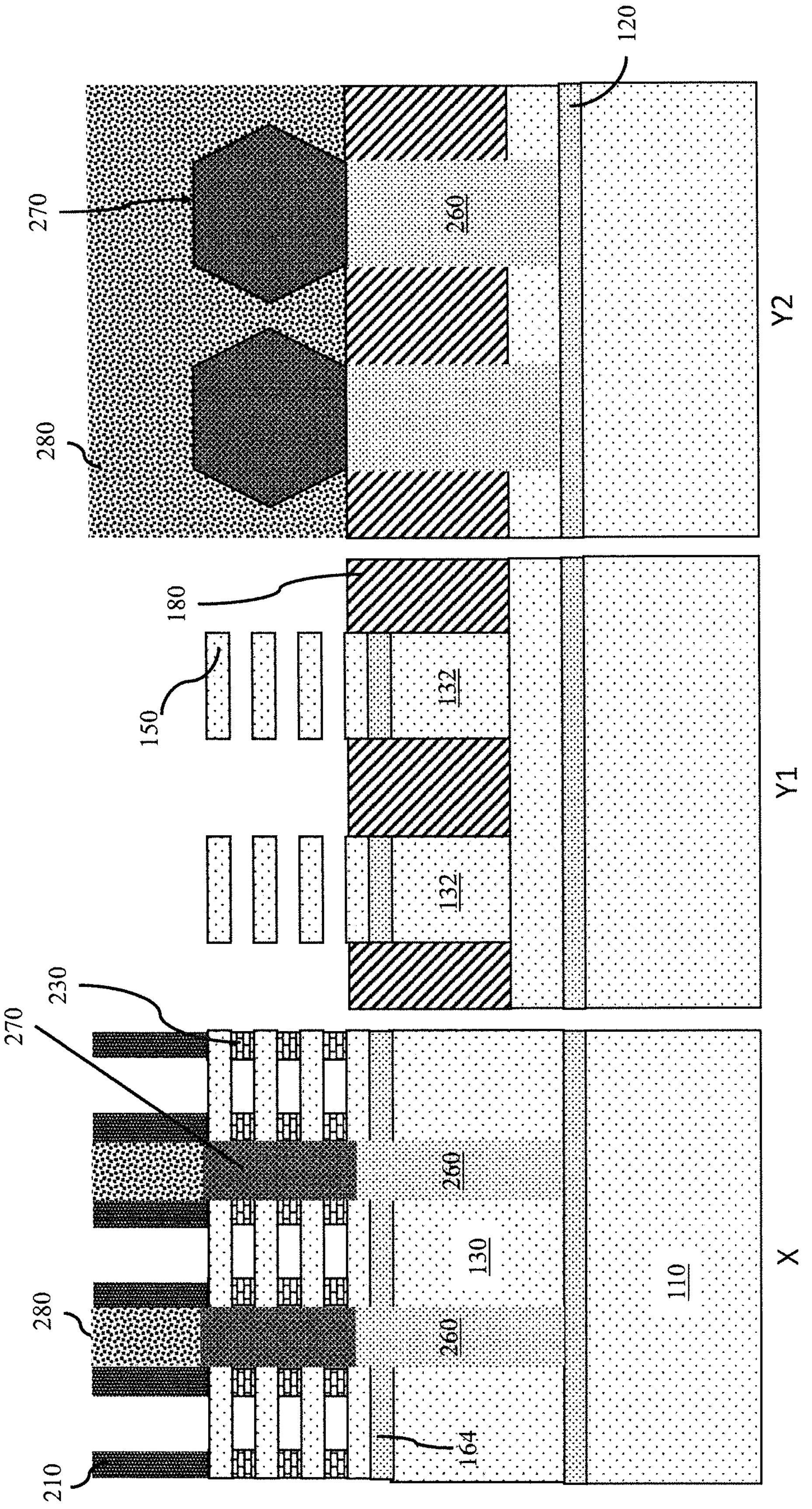
FIG. 9 includes cross-sectional side views showing an interlevel dielectric layer (ILD) formed on the source/drains, in accordance with an embodiment of the present invention.

FIG. 9 includes cross-sectional side views showing an interlevel dielectric layer (ILD) 280 formed on the source/drains 270, in accordance with an embodiment of the present invention.

In one or more embodiments, the ILD 280 can be formed on the source/drains 270. The ILD 280 can be deposited using any deposition technique, such as, e.g., atomic layer deposition (ALD), chemical vapor deposition (CVD), physical vapor deposition (PVD), etc. The ILD 280 may include a silicon oxide, a silicon oxynitride, or other planarizing dielectric material. The ILD 280 is planarized to flatten a top surface, using e.g., a chemical mechanical polish (CMP).

The ILD 280 can fill in the spaces between the insulating dielectric sidewalls 210 and above the source/drains 270. An etch is performed to remove dummy gates 190 using, e.g., an isotropic etch, (e.g., wet chemical etch) process that removes the dummy gates 190 from areas exposed by the CMP process.

Another etch process, such as an isotropic etch, is performed that selectively removes the nanosheet layers 160 selective to the nanosheet layers 150. The source/drains 270 are protected during the etching by the ILD 280 and the inner spacers 230.

Figure 10:
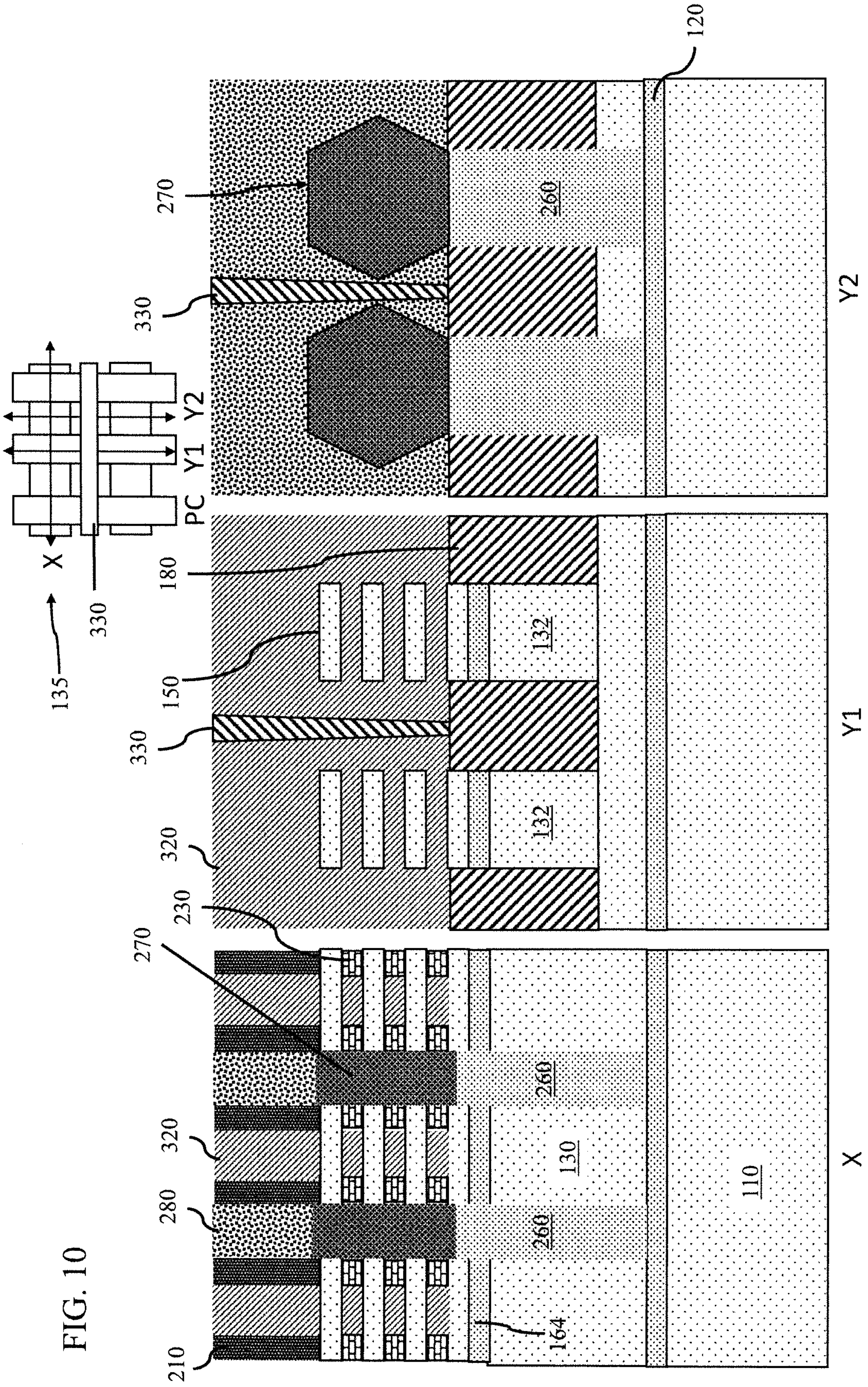
FIG. 10 includes cross-sectional side views showing formation of a replacement gate structure, in accordance with an embodiment of the present invention.

FIG. 10 includes cross-sectional side views showing formation of a replacement gate structure, in accordance with an embodiment of the present invention.

In one or more embodiments, replacement metal gate structures 320 can be formed in the spaces created by removal of the dummy gate structures 190 and nanosheet layers 160, where the replacement metal gate structures 320 can be formed by conformal deposition (e.g., atomic layer deposition (ALD)). In various embodiments, the replacement metal gate structures 320 can include a gate dielectric layer and a conductive gate fill. The gate dielectric layer can be formed on the semiconductor nanosheet layer segments 150 using a conformal deposition (e.g., ALD). A conductive gate fill can be formed on the gate dielectric layer, where the conductive gate fill can include a work function layer formed on the gate dielectric layer and a conductive gate electrode formed on the work function layer.

In various embodiments, the gate dielectric layer can be a high-k dielectric material, and the conductive gate fill can be, for example, a metal having an intended conductance and/or work function, for example, TiN, TiAl, TiC, TiAlC, tungsten (W), Al, Ru, etc.

The inner spacers 230 can electrically separate the replacement metal gate structures 320 from the source/drains 270.

In one or more embodiments, a gate cut 330 is formed to segment portions of the gate structure. The replacement metal gate structures 320 are patterned and etched, e.g., using a RIE or other suitable anisotropic etch to form gate cut openings. The gate cut openings are filled with a dielectric material, e.g., an oxide or nitride. The top surface is then planarized to form the gate cuts 330. In various embodiments, gate cuts 330 can be formed between source/drains 270.

A top view 135 shows how gate cut 330 runs across sections X, Y1 and Y2. The view 135 provides perspective to show how each process step affects each region of the device during fabrication.

Figure 11:
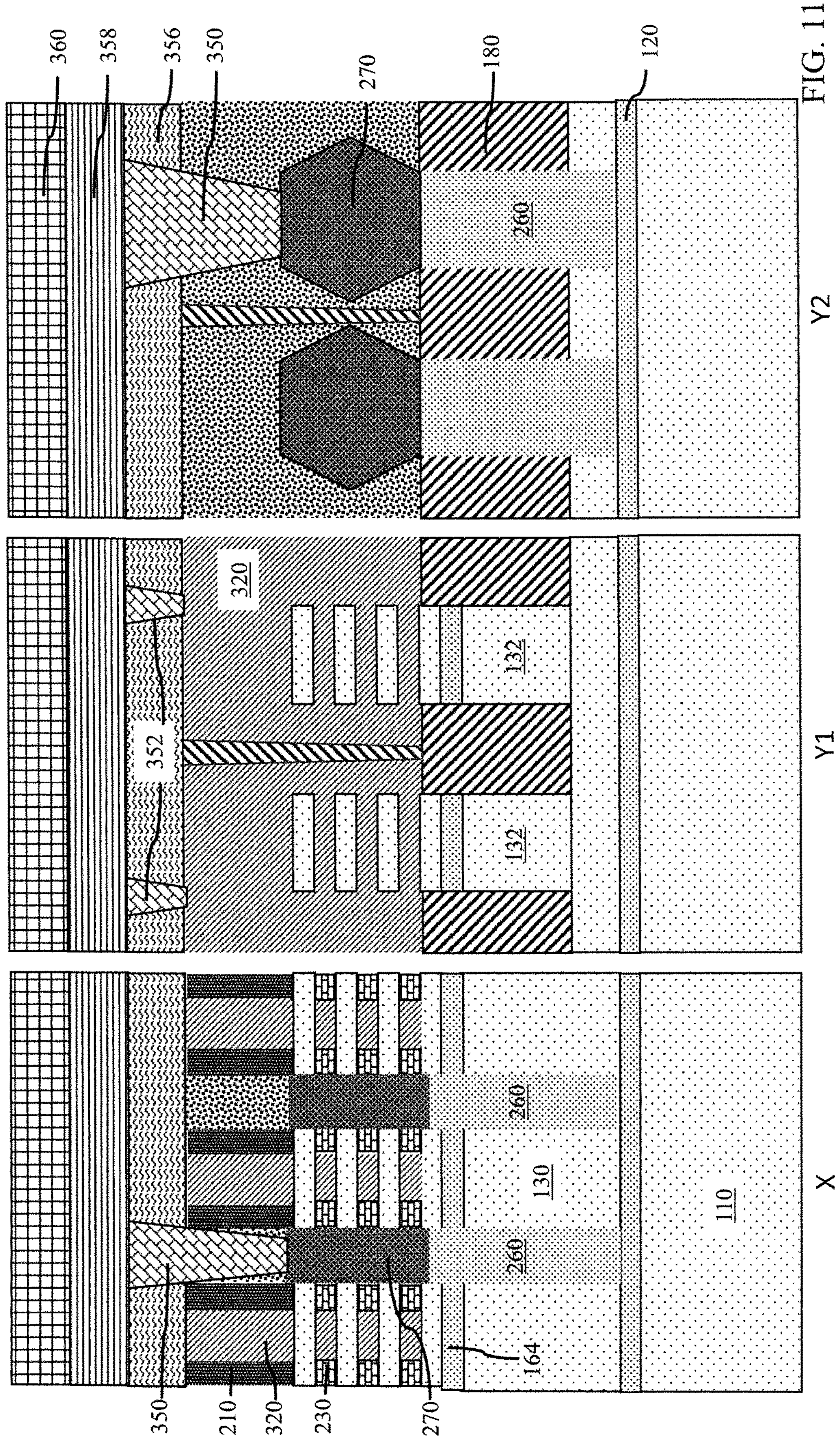
FIG. 11 includes cross-sectional side views showing the formation of another ILD layer, in accordance with an embodiment of the present invention.

FIG. 11 includes cross-sectional side views showing the formation of another ILD layer 356, in accordance with an embodiment of the present invention.

In one or more embodiments, the ILD layer 356 is formed over the device and patterned to create openings for the formation of contacts 350 and 352. The ILD 356 is etched in accordance with a contact opening mask using, using an anisotropic etch, such as RIE to expose gate metal 320 and source/drains 270 where appropriate in accordance with a device design.

A conductive fill layer is formed on the source/drains 270 and the replacement metal gate structures 320, in accordance with an embodiment of the present invention. In one or more embodiments, the conductive fill layer can be formed on the exposed surfaces of the source/drains 270 and the replacement metal gate structures 320 (to fill the contact openings) and over a top surface of the device by a blanket deposition.

In various embodiments, the conductive fill layer can include a silicide liner, such as Ti, Ni, NiPt, a metal adhesion layer such as TiN, and conductive metal fills, such as, e.g., W, Ru, or Co.

A top surface is planarized stopping on ILD 356 to form contacts 350 and 352. Middle-end-of the line (MOL) processing continues and back-end-of the-line (BEOL) processing is performed to develop metal structures for connecting the frontside of the device.

In one or more embodiments, a back-end-of-line (BEOL) interconnect layer 358 can be formed on the ILD layers 356, where the BEOL Interconnect layer 358 can include additional metal lines and vias for electrical connections to source/drain contacts 350 and gate contacts 352.

In one or more embodiments, a carrier layer or wafer 360, for example, a semiconductor wafer, can be attached to the top surface of the BEOL interconnect layer 358, where the carrier layer 360 can be attached through bonding. In various embodiments, the carrier layer 360 can be a semiconductor wafer or other wafer having a thickness sufficient to transfer and transport the attached substrate 110 and intervening layers and features.

Figure 12:
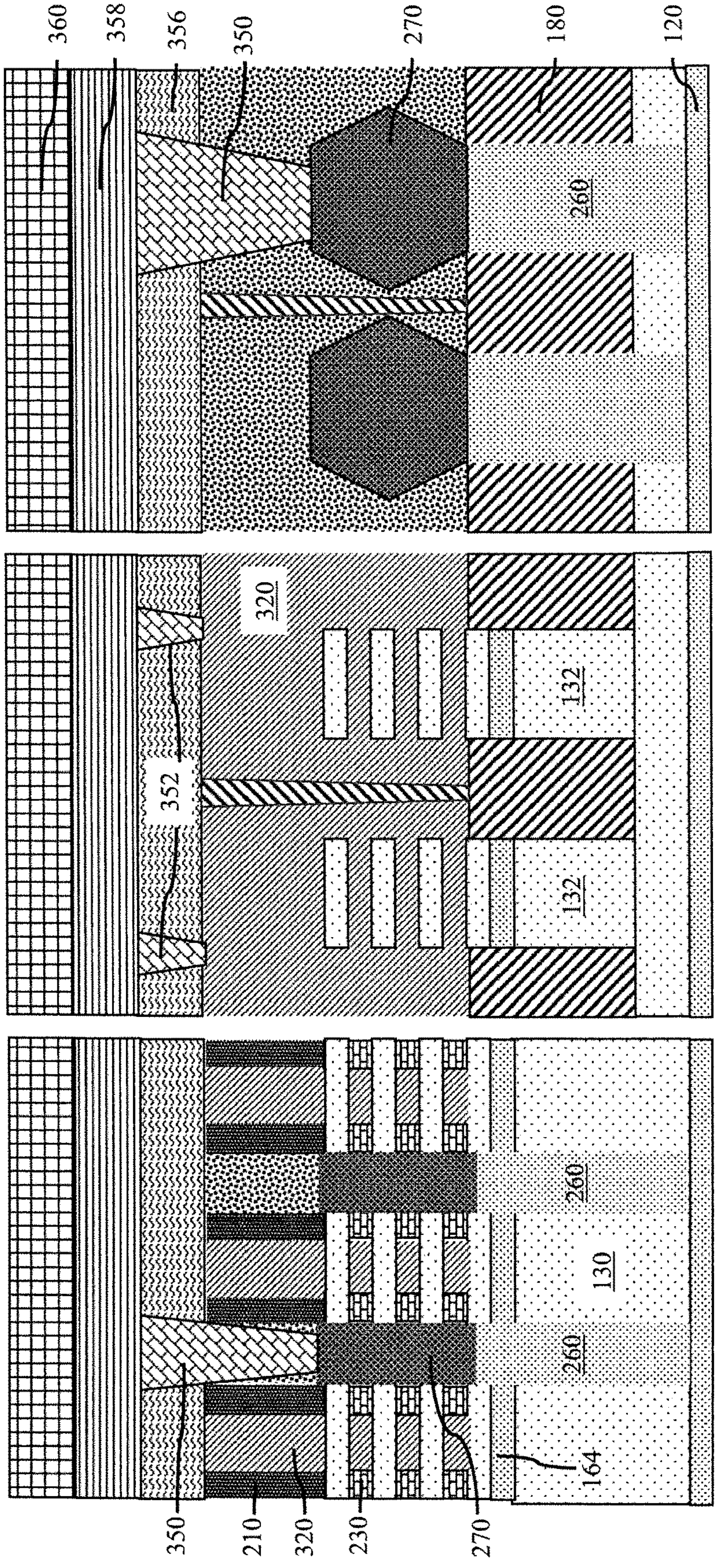
FIG. 12 includes cross-sectional side views showing removal of a substrate from a backside of the device, in accordance with an embodiment of the present invention.

FIG. 12 includes cross-sectional side views showing removal of the substrate 110 (FIG. 11), in accordance with an embodiment of the present invention.

In one or more embodiments, the device is flipped so that the backside is in a position to be processed, and after that, the substrate 110 can be removed, for example, using a combination of wafer grinding, CMP and/or selective etching (e.g., wet chemical etch) to expose the buried semiconductor layer 120, where the buried semiconductor layer 120 is etch-selective to the substrate material.

In one or more embodiments, the substrate 110 with the bonded carrier layer 360 can be flipped 180 degrees (i.e., inverted), so the bottom surface of the substrate 110 becomes the top working surface, and the carrier layer 360 becomes the support for the substrate 110 and the intervening layers and devices.

Figure 13:
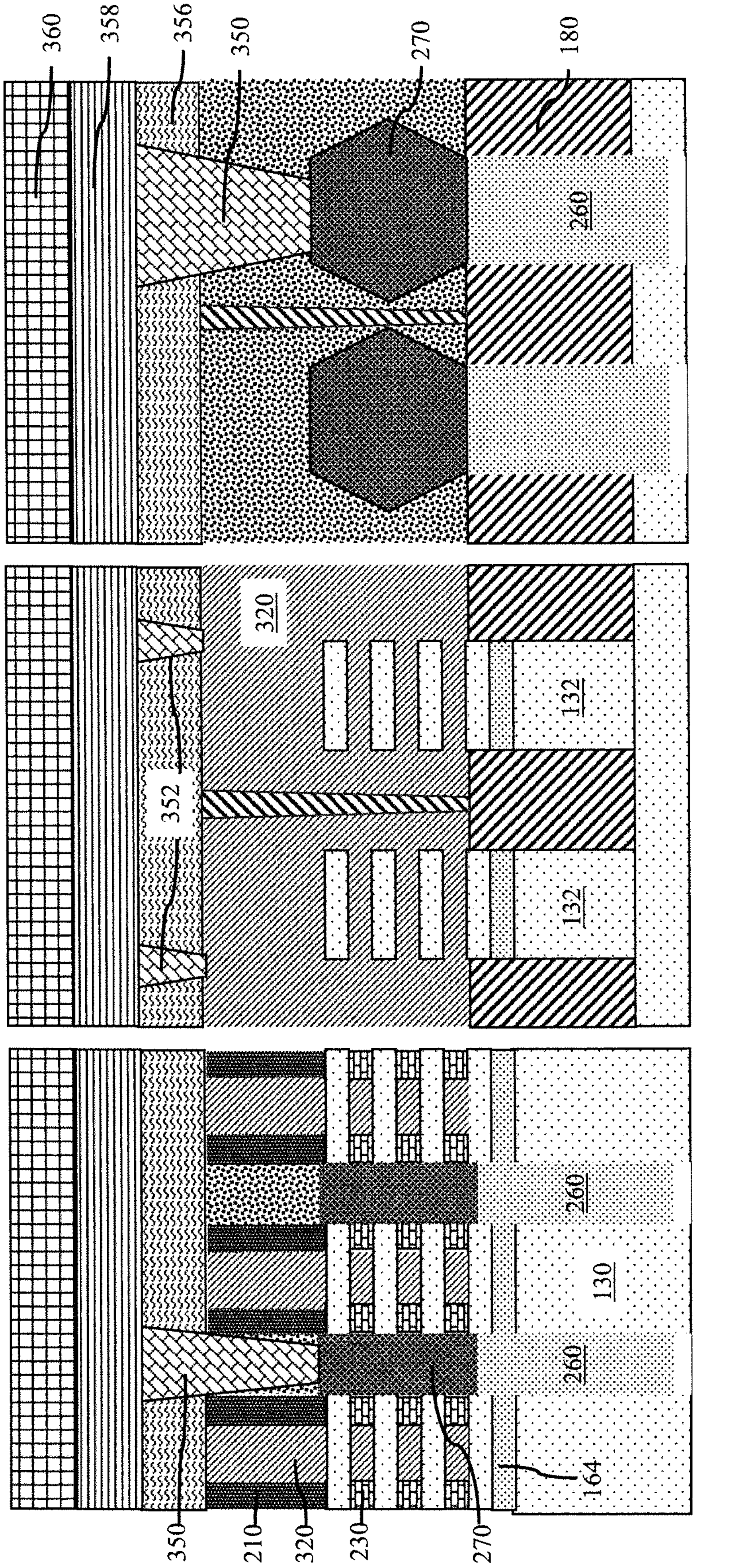
FIG. 13 includes cross-sectional side views showing removal of the buried semiconductor layer, in accordance with an embodiment of the present invention.

FIG. 13 includes cross-sectional side views showing removal of the buried semiconductor layer 120, in accordance with an embodiment of the present invention. In one or more embodiments, the buried semiconductor layer 120 can be removed by selective etching to expose the intermediate semiconductor layer 130 and sacrificial plugs 260. The exposure of intermediate semiconductor layer 130 and sacrificial plugs 260 permits selective etching in the next step.

Figure 14:
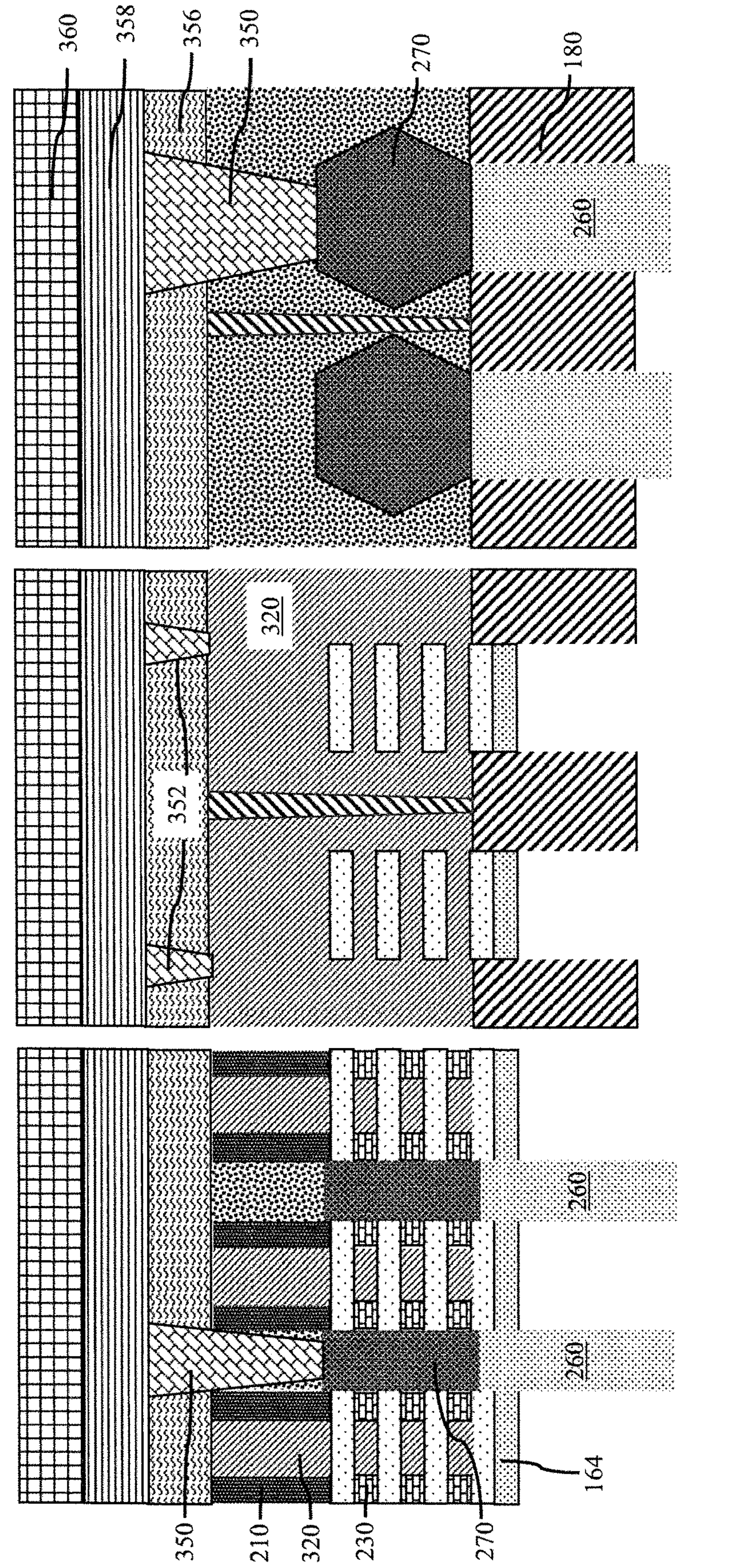
FIG. 14 includes cross-sectional side views showing the removal of the intermediate semiconductor layer and mesas, in accordance with an embodiment of the present invention.

FIG. 14 includes cross-sectional side views showing the removal of the intermediate semiconductor layer 130 and mesas 132 (FIG. 13), in accordance with an embodiment of the present invention.

In one or more embodiments, the intermediate semiconductor layer 130 and mesas 132 (FIG. 13) are selectively etched (e.g., wet chemical etch) to expose sacrificial plugs 260 and sacrificial nanosheet layer 164. The structure and processing of the device provides the benefit of having the source/drains 270 and the replacement metal gate structures 320 completely sealed off from the selective etching process.

Figure 15:
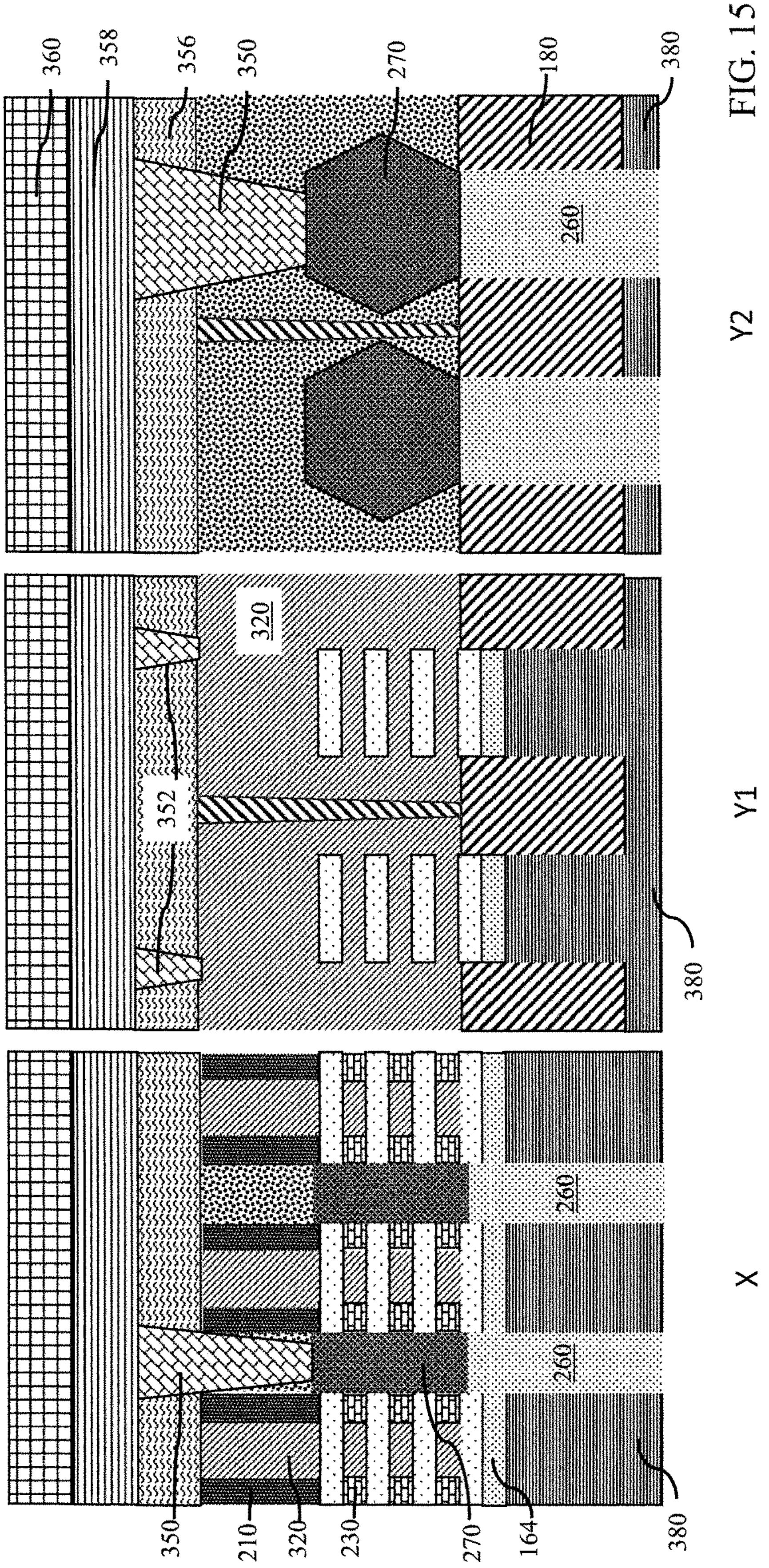
FIG. 15 includes cross-sectional side views showing formation of a backside interlayer dielectric (BILD) layer on the backside of the device, in accordance with an embodiment of the present invention.

FIG. 15 includes cross-sectional side views showing formation of a backside interlayer dielectric (BILD) layer

380 on the backside of the device, in accordance with an embodiment of the present invention.

In one or more embodiments, the BILD layer 380 can be formed by a blanket deposition (e.g., chemical vapor deposition (CVD)). The BILD layer 380 can be, e.g., SiN, SiBCN, SiOCN, SiOC, SiC, etc. The BILD layer 380 can be $SiO_2$, or low-k dielectrics. The BILD layer 380 can be planarized using a CMP process to provide a smooth, flat surface.

Figure 16:
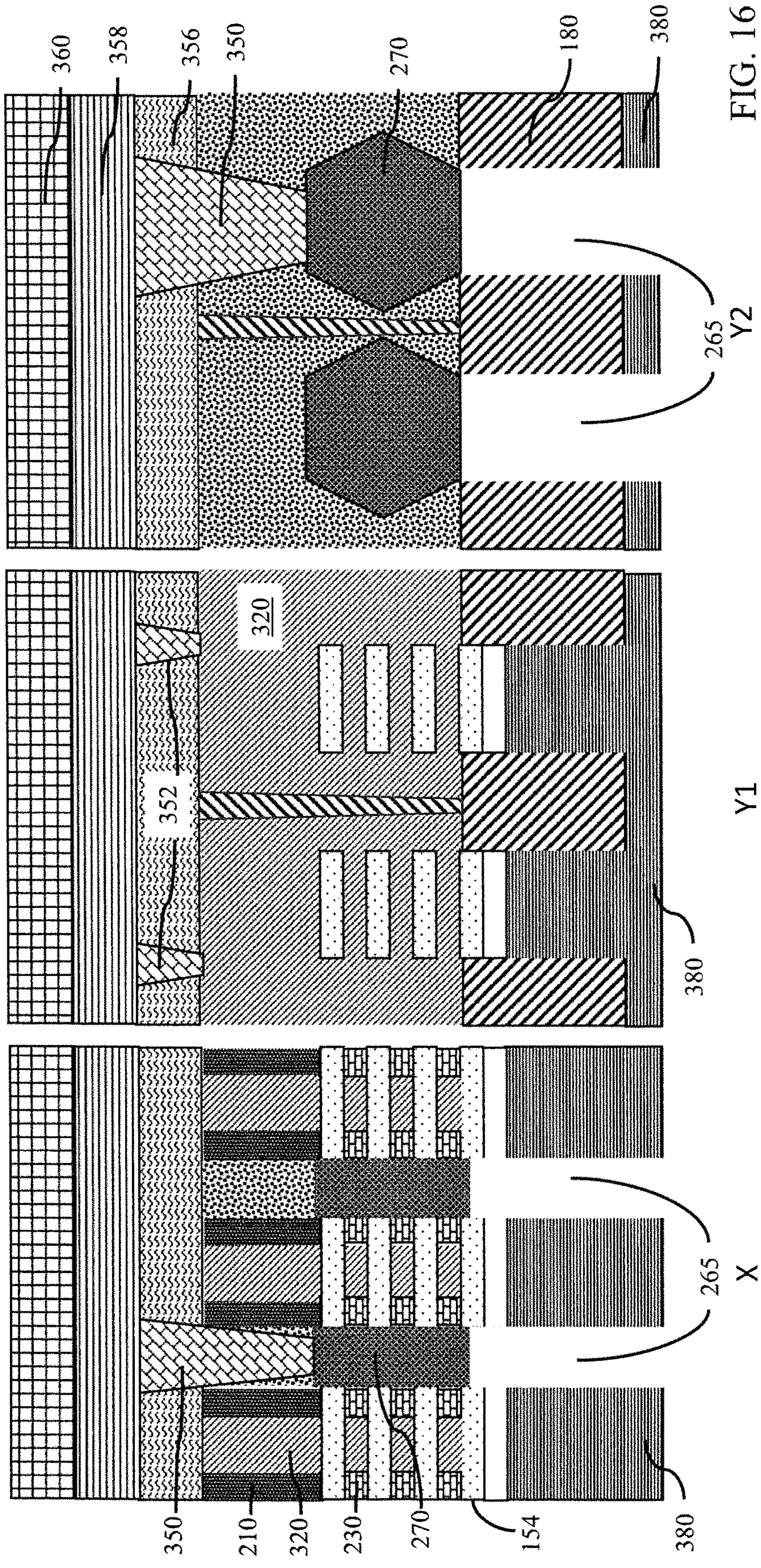
FIG. 16 includes cross-sectional side views showing removal of the sacrificial plugs and a last nanosheet layer to form trenches that expose a backside of the source/drains, in accordance with an embodiment of the present invention.

FIG. 16 includes cross-sectional side views showing removal of the sacrificial plugs 260 and bottom sacrificial nanosheet layer 164 (FIG. 15) to form trenches that expose a backside of the source/drains 270, in accordance with an embodiment of the present invention.

In one or more embodiments, the sacrificial plugs 260 can be removed, for example, using a selective isotropic etch to form openings 265 expose the sidewalls of the BILD layer 380 and backside of the source/drains 270. In this way, a nanosheet layer 154 is exposed for removal and trimming in another step.

Figure 17:
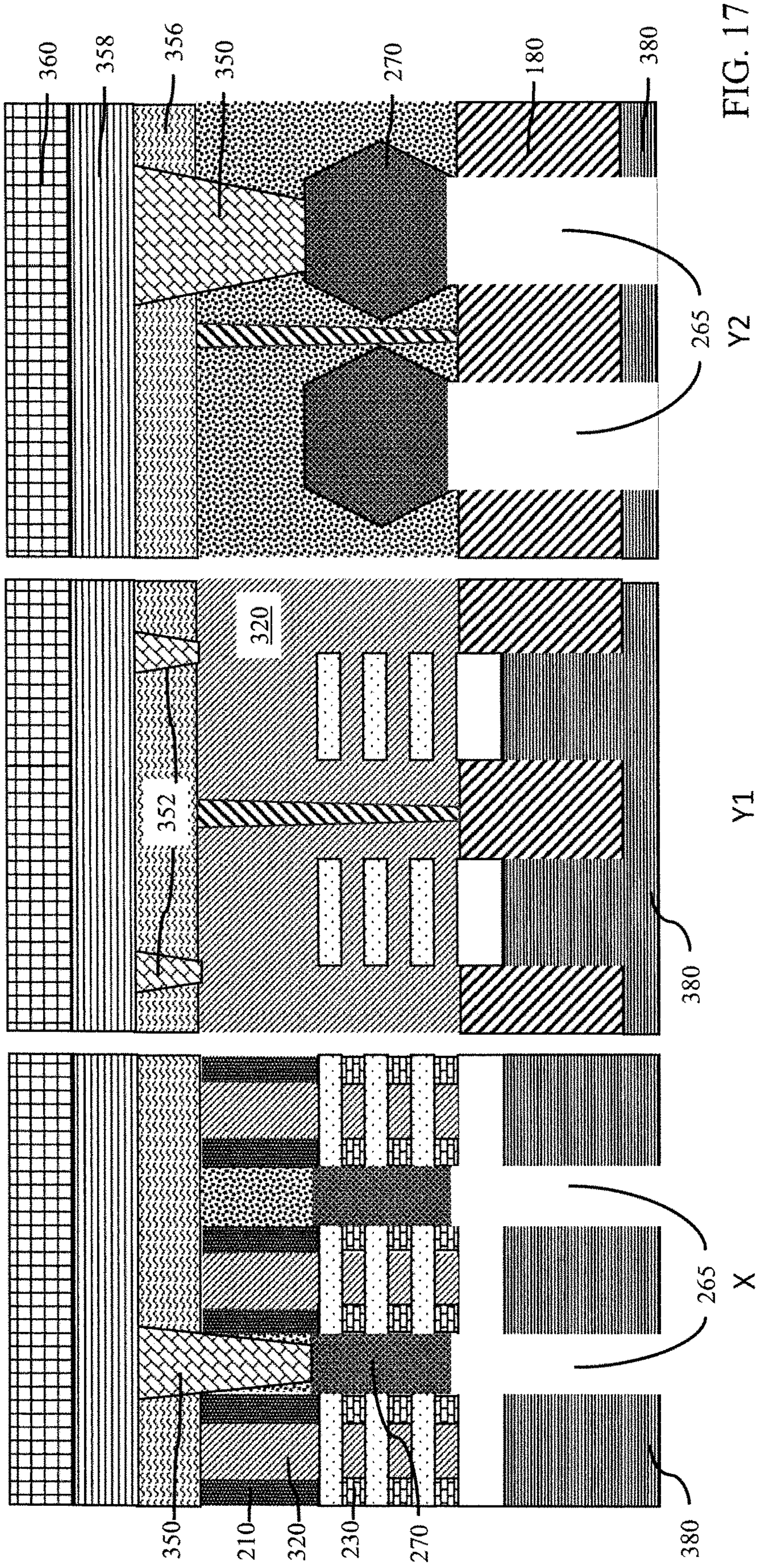
FIG. 17 includes cross-sectional side views showing the trimming by selectively etching a nanosheet layer and source/drains, in accordance with an embodiment of the present invention.

FIG. 17 includes cross-sectional side views showing the trimming by selectively etching the nanosheet layer 154 and source/drains 270, in accordance with an embodiment of the present invention.

In one or more embodiments, a selective etch, such as an isotropic wet etch, is performed to remove nanosheet layer 154 (FIG. 16) and to trim a small amount (trim etch) of material from the source/drains 270. In one embodiment, the small amount of material includes a thickness of less than 8 nm and preferably less than about 6 nm. The selective etch includes a chemistry that removes material from nanosheet layers and source/drains 270 selective to the dielectric materials of the STI 180, BILD 380 and inner spacers 230, as well as replacement HKMG structures 320. In one embodiment, the trim etch etches Si selective to materials of the STI 180, BILD 380, inner spacers 230 and replacement metal gate structures 320.

Figure 18:
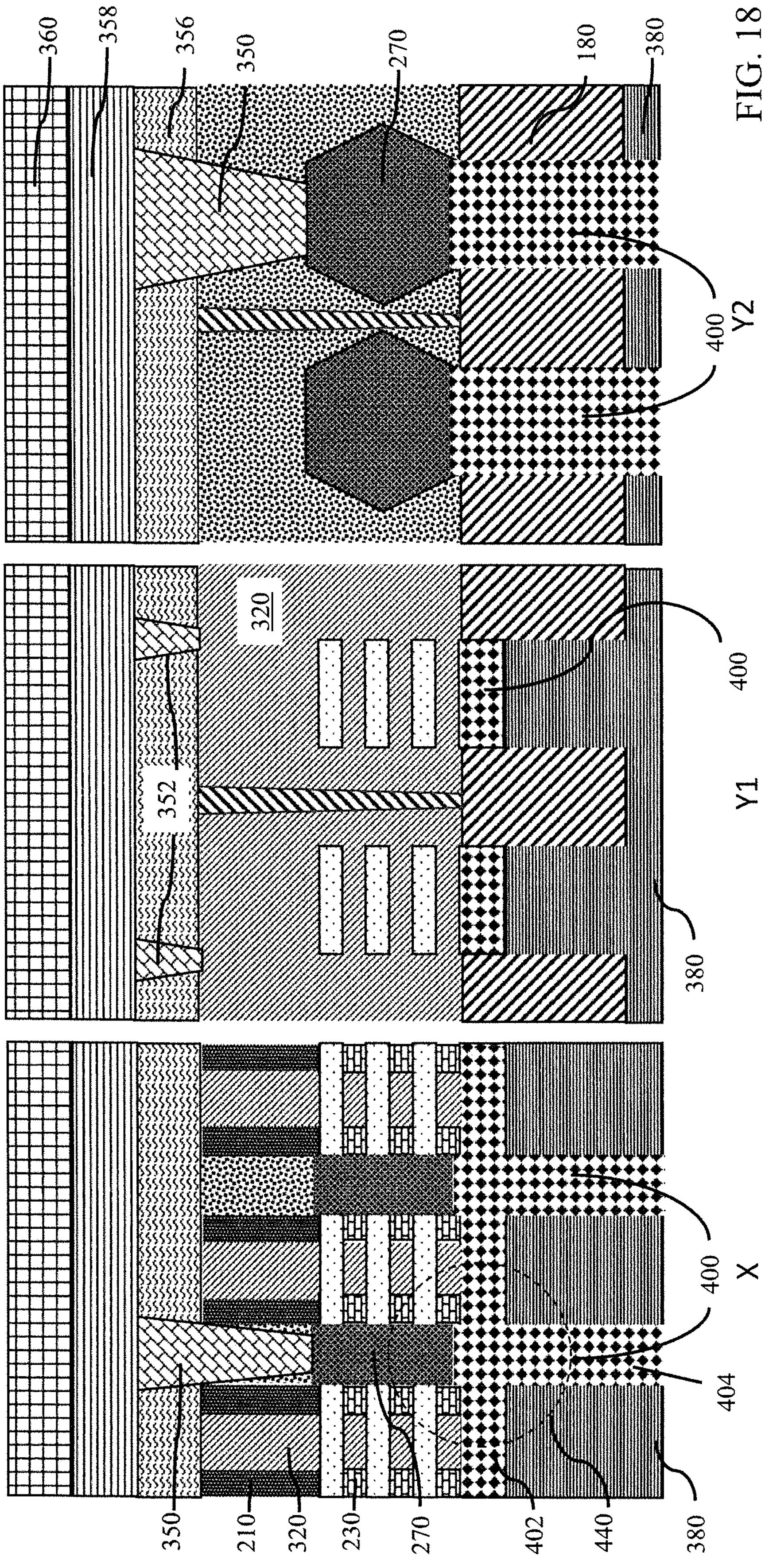
FIG. 18 includes cross-sectional side views showing a backside dielectric isolation (BDI) formed by a dielectric fill process, in accordance with an embodiment of the present invention.

FIG. 18 includes cross-sectional side views showing a backside dielectric isolation (BDI) 400 formed by a dielectric fill process, in accordance with an embodiment of the present invention.

The BDI 400 fills the volume left behind from the removal of sacrificial plugs 260, nanosheet layers 154, 164 and trimmed portions of the source/drains 270. The BDI 400 can be formed using an atomic layer deposition (ALD) process, although other dielectric fill processes can be employed. The BDI 400 can be, e.g., SiN, SiBCN, SiOCN, SiOC, SiC, etc. The BDI 400 can be $SiO_2$, or low-k dielectrics. The BDI 400 can include a material that is different than the material selected form BILD 380. After formation of BDI 400, portions can be planarized using a CMP process to provide a smooth, flat backside surface.

In one or more embodiments, the BDI 400 is self-aligned to source/drains 270 by being formed in a same trench as the source/drains 270 at different stages during the fabrication process.

In a useful embodiment, the BDI 400 can include a horizontal portion 402 in contact with replacement metal gate structures 320, e.g., HKMG, and a vertical portion 404 can be aligned to the source/drains 270 in a same column. In one or more embodiments, the BDI 400 can include a seam where the horizontal portion 402 and the vertical portion 404 intersect below the source/drain regions 270. The seam can include a T-shaped structure. Detail 440 is shown in greater detail in FIG. 21. The BDI 400 provides reliable and high magnitude electrical isolation between the gate/channels of the transistors as well as backside contacts (formed in later steps).

Figure 19:
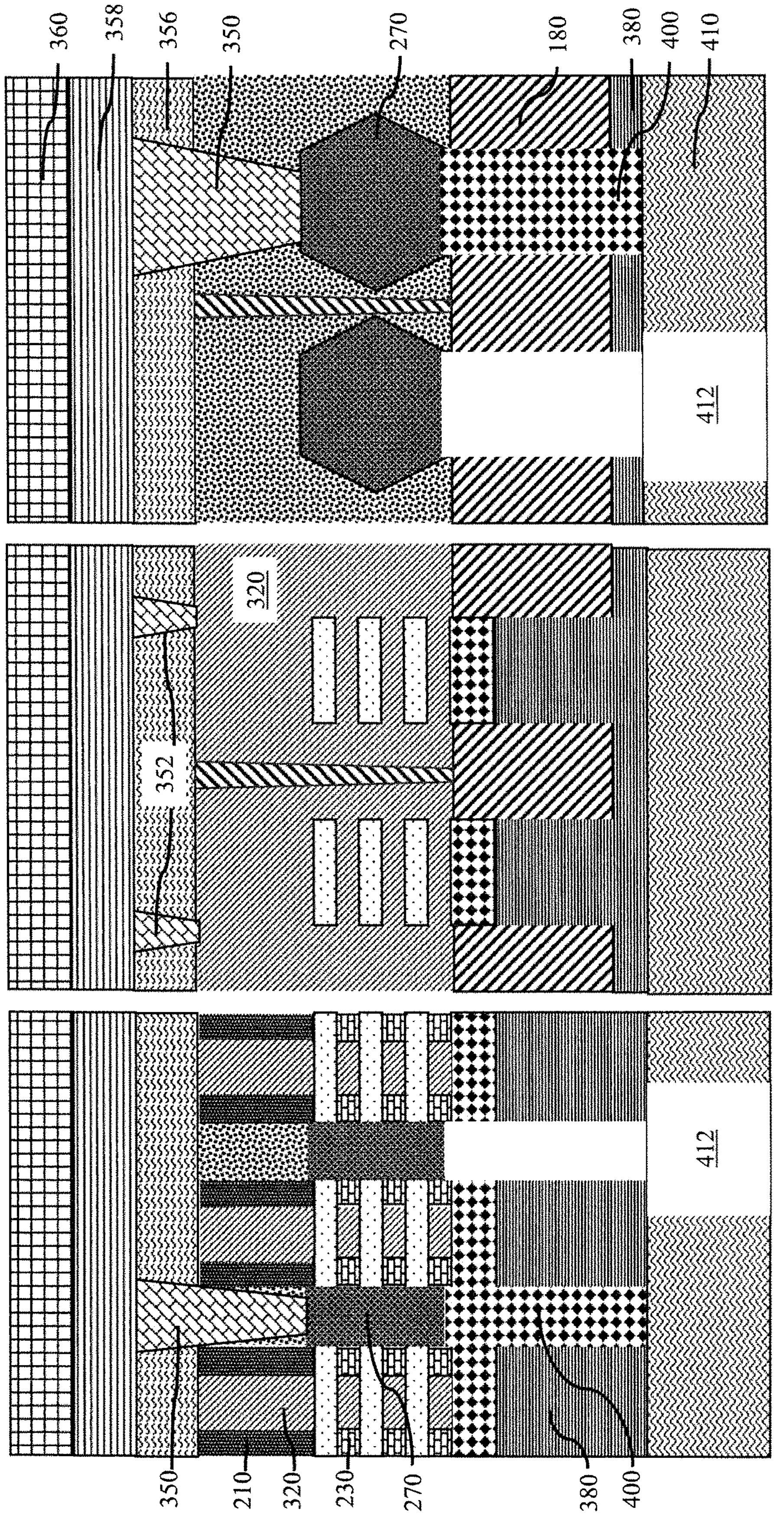
FIG. 19 includes cross-sectional side views showing a planarizing layer formed on the backside of the device, in accordance with an embodiment of the present invention.

FIG. 19 includes cross-sectional side views showing a backside contact masking layer 410 formed on the backside of the device, in accordance with an embodiment of the present invention.

The backside contact masking layer 410 can be an OPL or other hardmask layer. The masking layer 410 can be deposited by spin on coating or deposited by any suitable method. The masking layer 410 can be patterned to locate contacts openings 412 using lithographic patterning and etch processes. Once patterned, the openings 412 can be extended by selectively etching the BDI 400 selectively to the BILD 380 to expose source/drains 270. Any suitable etch process can be employed to selectively etch away the BDI 400 through openings 412.

Figure 20:
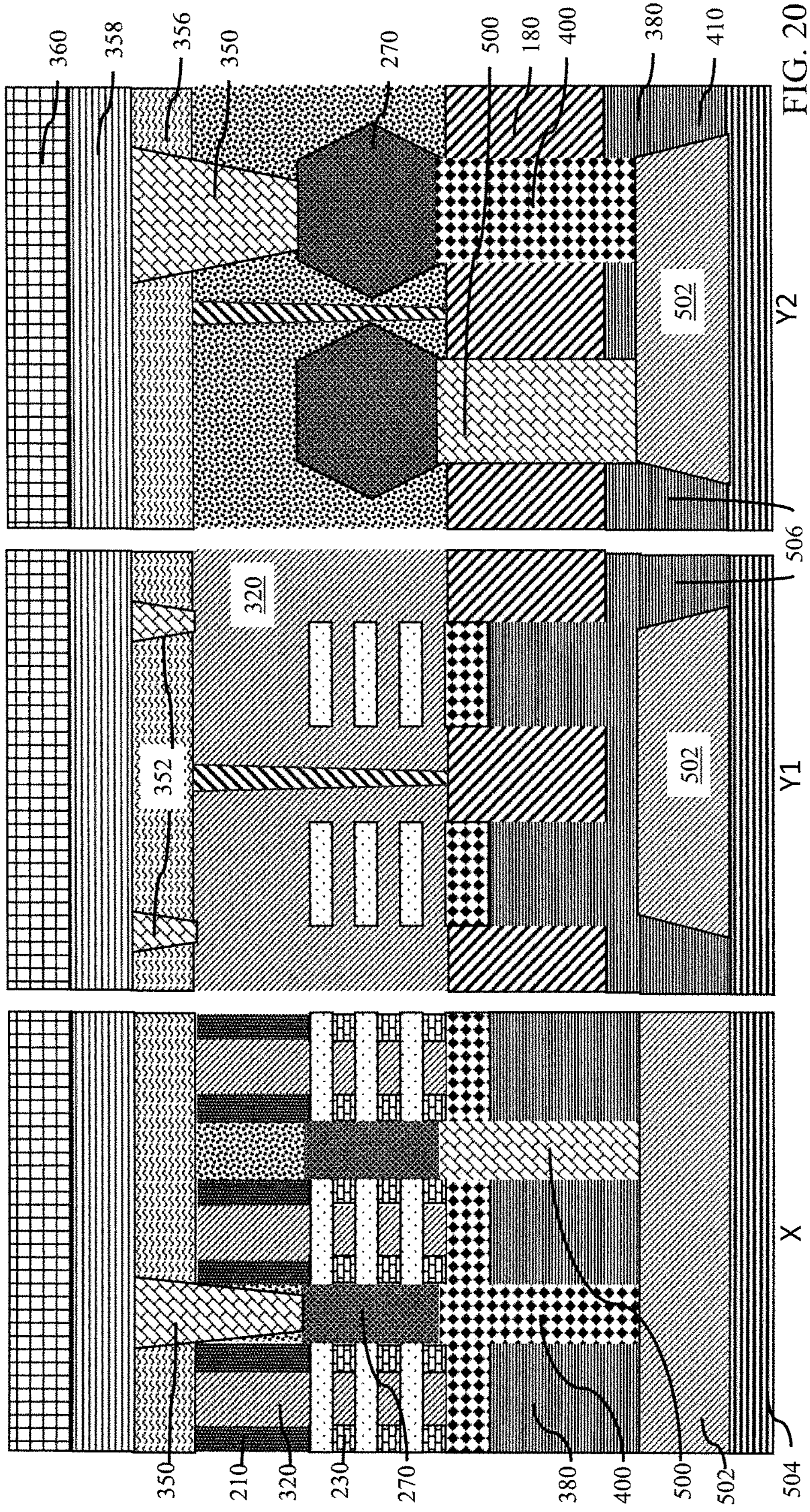
FIG. 20 includes cross-sectional side views showing contacts formed connecting source/drains to a backside power rail (BPR) on the backside of the device, in accordance with an embodiment of the present invention.

FIG. 20 includes cross-sectional side views showing contacts 500 formed connecting source/drains 270 to a backside power rail (BPR) 502 on the backside of the device, in accordance with an embodiment of the present invention.

Conductive contacts 500 can be formed through openings 412 (FIG. 19) by a blanket deposition (e.g., CVD) followed by a CMP to provide a smooth, flat surface to BILD 380 to remove excess metal and the planarizing layer 410. The backside conductive contact(s) 500 can be on and in electrical contact with the source/drain(s) 270.

In various embodiments, the backside conductive contacts 500 can be a metal, for example, a silicide liner, such as Ti, Ni, NiPt, a metal adhesion layer, such as, TiN, and conductive metal fills such as, W, Ru, or Co.

During processing, at least one vertical BDI 400 can be removed and replaced with a backside contact 500. The backside contact 500 can electrically connect a S/D region 270 with the BPR 502 and, ultimately, a backside power distribution network (BSPDN) 504.

In one or more embodiments, an additional backside interlevel dielectric layer (BILD) 506 can be formed on the backside ILD layer 380 and BDI 400, where the BILD 506 can be formed by a blanket deposition. The BILD 506 can cover the BILD 380. In various embodiments, the BILD 506 can be an electrically insulating dielectric material, for example, silicon oxide ($SiO_x$).

In one or more embodiments, one or more BSPRs 502 can be formed in the BILD 506 and BILD 380, where the BSPRs 502 can be formed through masking, lithography, etching and metal deposition. The BSPRs 502 can be on and in electrical contact with the backside conductive contacts 500.

In one or more embodiments, a backside power delivery network (BSPDN) 504 can be formed on and to the BSPR 502 and on the BILD 506 and/or BILD 380, where a backside power rail 502 can connect to a backside conductive contact 500 to provide a voltage/current to the source/drains 270.

Figure 21:
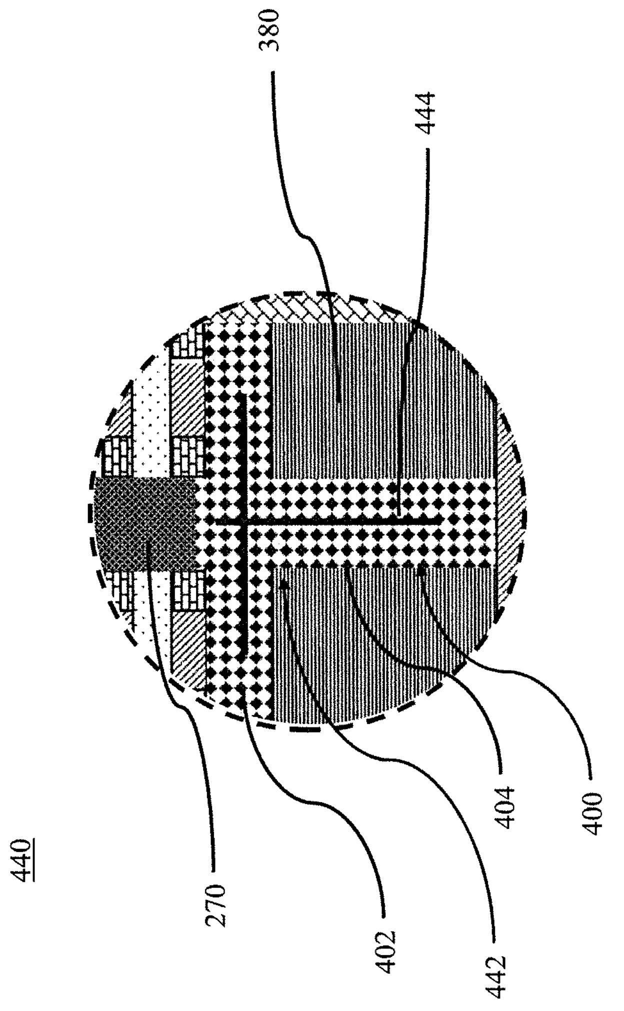
FIG. 21 includes a cross-sectional view of a detail showing one embodiment of the BDI, in accordance with an embodiment of the present invention.

FIG. 21 includes a cross-sectional view showing one embodiment of the BDI 400, in accordance with an embodiment of the present invention.

BDI 400 can include a seam 442 where the horizontal portion 402 and the vertical portion 404 intersect below the source/drain regions 270. The seam 442 can include a T-shaped structure 444 indicated as a "T" in FIG. 21. The location of detail 440 is shown in FIG. 18. The BDI 400 provides reliable and high magnitude isolation between the backside contact and gate/channels. The horizontal portion 402 extends between power circuitry and the transistors of the device. The horizontal portions 402 electrically isolate backside contacts and provide a dielectric barrier between backside metal structures and transistor gates. The vertical portion 404 provides additional dielectric isolation for active regions (e.g., S/D).

Figure 22:
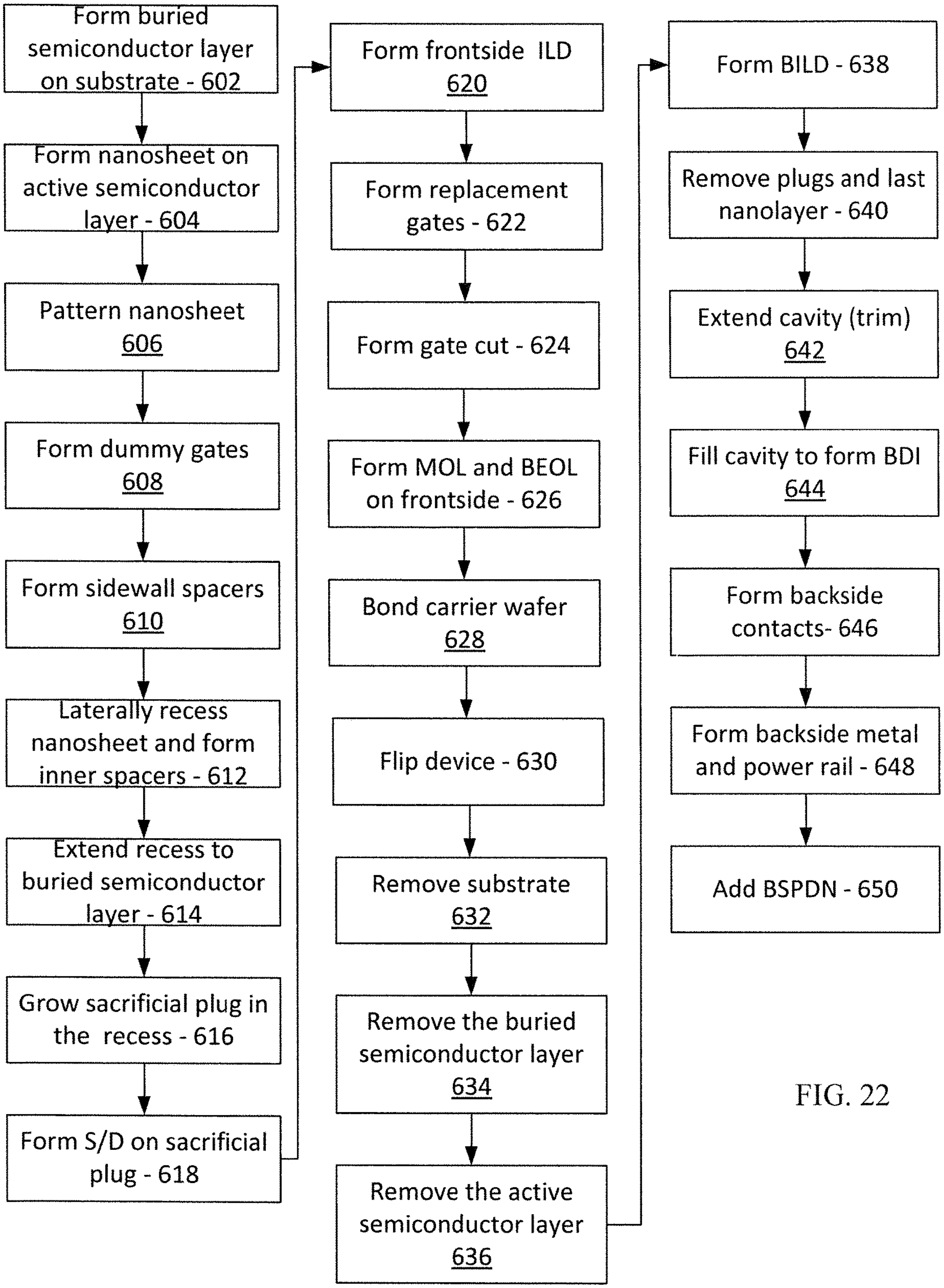
FIG. 22 is a flow diagram showing process steps for forming a semiconductor device in accordance with one or more embodiments.

FIG. 22 is a flow diagram showing process steps for forming a semiconductor device in accordance with one or more embodiments. In block 602, a substrate is provided and prepared for epitaxial growth. A buried semiconductor layer is formed on the substrate as well and an intermediate semiconductor layer. In block 604, a nanosheet or stack of alternating nanolayers is formed on the intermediate semiconductor layer. In block 606, segments are etched into the stack of nanolayers (patterning the nanolayers) and the intermediate semiconductor layer. A shallow trench isolation is deposited in trenches formed by the etching. In block 608, dummy gates are formed by depositing a dummy gate dielectric followed by a hardmask. The hardmask is patterned to pattern dummy gates.

In block 610, sidewall spacers are formed on sides of the dummy gates, then the nanolayers are further patterned using the dummy gates with the sidewall spacers to etch down to a second to last nanolayer (of a first material (e.g., Si) and form a recess. In block 612, a second material (e.g., SiGe) of the alternating nanolayers of the stack is laterally recessed from the recess. An inner spacer dielectric material is formed within the lateral recesses. In block 614, the recesses are extended down through the second to last and the last nanolayers, through the intermediate semiconductor layer and stopping on the buried semiconductor layer. This recess will be employed to locate and self-align a source/drain and a vertical portion of a backside dielectric isolation. The recesses are formed through the stack of nanolayers from a frontside opposite the side having the substrate.

In block 616, a sacrificial plug is grown in the recess. The plug can be epitaxially grown, e.g., SiGe, although other processes and materials can be employed. The plug fills a portion of the recess to a height relative to the stack of nanolayers to form a sacrificial plug within the recesses. The plug locates a bottom position for the source/drains. In block 618, source/drains can be formed on the plug. In one embodiment, the source/drains are formed by epitaxially growth on the sacrificial plug.

In block 620, an interlevel dielectric layer is formed and planarized on the frontside of the device. The second material (e.g., SiGe) of the nanolayers is etched to remove this material from the stack of nanolayers. The dummy gate material is also removed. In block 622, replacement gate materials (e.g. gate dielectric and gate conductor) are formed in the areas where the dummy gates and the second material of the nanosheets was removed.

In block 624, a gate cut can be provided to shape/size the gate structures. In block 626, middle and back end of line metal structures can be formed on the frontside of the device. In block 628, a carrier wafer or layer can be bonded to the frontside of the device.

In block 630, the device is flipped to permit processing on the backside. In block 632, the substrate is removed up to the buried semiconductor layer. In block 634, the buried semiconductor layer is removed to reveal the intermediate semiconductor layer. In block 636, the intermediate semiconductor layer is removed to expose plugs in the recesses from the backside.

In block 638, the plugs that were exposed are buried in a backside interlevel dielectric layer (BILD) of a first dielectric material. The first dielectric material is then planarized. The plug completely protects (e.g., seals off) the source/drain and gate structures during backside processing (e.g., etching).

In block 640, the plugs and a lowest nanolayer (second material) in the stack of nanolayers are removed to form a cavity. In block 642, the cavity can be extended by removing the second to last nanolayer of the stack (first material). This can include a trim, e.g., a Si trim to remove less than about 8 nm of material.

In block 644, the cavity is filled with a second dielectric material to form backside dielectric isolation (BDI) to electrically isolate a transistor formed in a region of the stack of nanolayers from a power circuit on the backside. Components of the transistors include the source/drains and the replacement metal gate structure. The cavity can be filled using an ALD process. The cavity can include a horizontal portion and a vertical portion, and the filled cavity forms the backside dielectric isolation. In one embodiment, the horizontal portion and the vertical portion intersect to form a T-shaped cross-section such that the vertical portion is aligned with the source/drain in the recesses. The second dielectric material of the BDI is selectively etchable relative to the first dielectric material of the BILD.

In block 646, contacts are formed from the backside to the source/drain in the recess through the BDI. The contacts pass through a horizontal portion and replace a vertical portion of the BDI where the contact connects to selected source/drains. In block 648, additional processing includes metallizations on the backside of the device. This can include another BILD followed by the formation of a backside power rail (BPR) (e.g., metal deposition and planarization). In block 650, backside power distribution network (BSPDN) is fabricated or provided. The BPR and the BSPDN are parts of a power circuit.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The terminology used herein is for the purpose of describing particular embodiments only and is not intended to be limiting of example embodiments. As used herein, the singular forms "a." "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:

forming recesses through a stack of nanolayers from a frontside opposite a substrate to a buried semiconductor layer through an intermediate semiconductor layer;

filling a portion of the recesses to a height relative to the stack of nanolayers to form a sacrificial plug within the recesses;

forming a source/drain on the plug within the recesses;

removing the substrate, the intermediate semiconductor layer and the buried semiconductor layer to expose plugs in the recesses from a backside opposite the frontside;

burying the plugs that were exposed in a first dielectric material;

removing the plugs and a lowest nanolayer in the stack of nanolayers to form a cavity; and filling the cavity with a second dielectric material to form backside dielectric isolation to electrically isolate a transistor formed in a region of the stack of nanolayers from a power circuit on the backside.

2. The method as recited in claim 1, wherein the stack of nanolayers are included in a metal gate structure of the transistor and filling the cavity includes forming the backside dielectric isolation horizontally between the metal gate structure and the power circuit.

3. The method as recited in claim 1, wherein filling the cavity includes forming the backside dielectric isolation vertically between the source/drain and the power circuit.

4. The method as recited in claim 3, wherein forming the backside dielectric isolation vertically between the source/drain and the power circuit includes forming the backside dielectric isolation vertically self-aligned to the source/drain by forming the backside dielectric in the recesses from the backside.

5. The method as recited in claim 1, wherein the cavity includes a horizontal portion and a vertical portion and filling the cavity includes filling the horizontal portion and the vertical portion to form the backside dielectric isolation.

6. The method as recited in claim 5, wherein the horizontal portion and the vertical portion intersect to form a T-shaped cross-section where the vertical portion is aligned with the source/drain in the recesses.

7. The method as recited in claim 1, wherein the second dielectric material is selectively etchable relative to the first dielectric material.

8. The method as recited in claim 1, further comprising forming contacts from the backside to the source/drain through the backside dielectric isolation.

9. The method as recited in claim 1, further comprising forming gate structures from the stack of nanolayers.

10. The method as recited in claim 9, wherein removing the substrate, the intermediate semiconductor layer and the buried semiconductor layer to expose plugs in the recesses from a backside opposite the frontside includes etching the substrate, the intermediate semiconductor layer and the buried semiconductor layer such that the plug completely protects the source/drain and gate structures.

11. A semiconductor device, comprising: a frontside including first metal structures;

transistors disposed between the frontside and a backside opposite the frontside, each transistor including a source/drain positioned within a stack of nanolayers, the stack of nanolayers forming a gate structure;

a power circuit on the backside and connected to the transistors by backside contacts; and a backside dielectric isolation having a horizontal portion along a backside of the gate structure and a vertical portion substantially perpendicular to the backside and self-aligned to selected source/drains to electrically isolate the power circuit from the transistors, wherein the horizontal portion directly contacts at least one gate metal of the transistors.

12. The semiconductor device as recited in claim 11, wherein the power circuit includes a power rail coupled to the transistors through the backside dielectric isolation by the backside contacts.

13. The semiconductor device as recited in claim 11, wherein the backside contacts are formed through vertical portions of the backside dielectric isolation.

14. The semiconductor device as recited in claim 11, wherein the power circuit includes a power distribution network.

15. The semiconductor device as recited in claim 11, further comprising a backside interlevel dielectric layer disposed between a power network and the transistors, the backside interlevel dielectric layer being a different material than the backside dielectric isolation.

16. The semiconductor device as recited in claim 15, wherein the backside dielectric isolation passes through the backside interlevel dielectric layer.

17. The semiconductor device as recited in claim 11, wherein the backside dielectric isolation includes a T-shaped cross-section where the vertical portion is aligned with the source/drain.

18. A semiconductor device, comprising: a frontside including first metal structures;

transistors disposed between the frontside and a backside opposite the frontside, each transistor including source/drains positioned within a stack of nanolayers, the stack of nanolayers forming a gate structure;

a backside power rail on a backside power delivery network (BSPDN);

a backside interlevel dielectric layer on the backside power rail and the BSPDN; and a backside dielectric isolation adjacent to and passing through the backside interlevel dielectric layer, the backside dielectric isolation having a horizontal portion along a backside of the gate structure and a vertical portion substantially perpendicular to the backside and self-aligned to selected source/drains to electrically isolate a power circuit from the transistors.

19. The semiconductor device as recited in claim 18, further comprising backside contacts passing through selected vertical portions of the backside dielectric isolation to connect the transistors to the power rail.

20. The semiconductor device as recited in claim 18, wherein the backside interlevel dielectric layer is a different material than the backside dielectric isolation.

* * * * *